(12) United States Patent
Chang et al.

(10) Patent No.: US 11,935,889 B2
(45) Date of Patent: Mar. 19, 2024

(54) FIN STRUCTURE AND METHOD OF FORMING SAME THROUGH TWO-STEP ETCHING PROCESSES

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 227 days.

(21) Appl. No.: 17/097,423

(22) Filed: Nov. 13, 2020

(65) Prior Publication Data

US 2021/0066290 A1 Mar. 4, 2021

Related U.S. Application Data

(60) Continuation of application No. 16/050,668, filed on Jul. 31, 2018, now Pat. No. 10,840,242, which is a
(Continued)

(51) Int. Cl.
*H01L 27/08* (2006.01)
*H01L 21/8234* (2006.01)
(Continued)

(52) U.S. Cl.
CPC .. *H01L 27/0886* (2013.01); *H01L 21/823431* (2013.01); *H01L 21/823481* (2013.01);
(Continued)

(58) Field of Classification Search
CPC ........... H01L 27/0886; H01L 29/66545; H01L 21/823481; H01L 21/823431
(Continued)

(56) References Cited

U.S. PATENT DOCUMENTS 7,312,018 B2 12/2007 Ito et al.
7,425,740 B2 9/2008 Liu et al.
(Continued)

FOREIGN PATENT DOCUMENTS

CN 102044470 A 5/2011
CN 103515390 A 1/2014
(Continued)

*Primary Examiner* — Mohammad M Hoque
(74) *Attorney, Agent, or Firm* — Slater Matsil, LLP

(57) ABSTRACT

A method includes, in a first etching step, etching a semiconductor substrate to form first recesses in a first device region and second recesses in a second device regions simultaneously. A first semiconductor strip is formed between the first recesses. A second semiconductor strip is formed between the second recesses. In a second etching step, the semiconductor substrate in the second device region is etched to extend the second recesses. The first recesses and the second recesses are filled with a dielectric material to form first and second isolation regions in the first and second recesses, respectively. The first isolation regions and the second isolation regions are recessed. Portions of the semiconductor substrate in the first and the second device regions protrude higher than top surfaces of the respective first and second isolation regions to form a first and a second semiconductor fin, respectively.

20 Claims, 23 Drawing Sheets

Related U.S. Application Data division of application No. 15/407,094, filed on Jan. 16, 2017, now Pat. No. 10,217,741.

(60) Provisional application No. 62/405,670, filed on Oct. 7, 2016, provisional application No. 62/370,553, filed on Aug. 3, 2016.

(51) Int. Cl.
*H01L 21/84* (2006.01)
*H01L 27/088* (2006.01)
*H01L 27/12* (2006.01)
*H01L 29/08* (2006.01)
*H01L 29/66* (2006.01)

(52) U.S. Cl.
CPC ........ *H01L 21/845* (2013.01); *H01L 27/1211* (2013.01); *H01L 29/0847* (2013.01); *H01L 29/66545* (2013.01)

(58) Field of Classification Search
USPC ........................................................ 257/401
See application file for complete search history.

(56) References Cited

U.S. PATENT DOCUMENTS

| | | | |
|---|---|---|---|
| 8,048,723 B2 | 11/2011 | Chang et al. | |
| 8,053,299 B2 | 11/2011 | Xu | |
| 8,183,627 B2 | 5/2012 | Currie | |
| 8,415,718 B2 | 4/2013 | Ku | |
| 8,497,177 B1 | 7/2013 | Chang et al. | |
| 8,609,518 B2 | 12/2013 | Wann et al. | |
| 8,618,556 B2 | 12/2013 | Wu et al. | |
| 8,633,516 B1 | 1/2014 | Wu et al. | |
| 8,703,565 B2 | 4/2014 | Chang et al. | |
| 8,742,509 B2 | 6/2014 | Lee et al. | |
| 8,753,940 B1 | 6/2014 | Wei et al. | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,815,712 B2 | 8/2014 | Wan et al. | |
| 8,846,465 B2 | 9/2014 | Lee et al. | |
| 9,123,659 B1 | 9/2015 | Fu et al. | |
| 9,209,178 B2 | 12/2015 | Kanakasabapathy et al. | |
| 9,455,198 B1 | 9/2016 | Yu et al. | |
| 9,583,398 B2 | 2/2017 | Liaw | |
| 9,607,985 B1 * | 3/2017 | Tseng .............. H01L 21/823431 | |
| 9,847,224 B2 | 12/2017 | Kim et al. | |
| 9,899,388 B2 | 2/2018 | Kim et al. | |
| 10,014,223 B2 | 7/2018 | Kuo et al. | |
| 2013/0273711 A1 | 10/2013 | Liu et al. | |
| 2013/0277720 A1 | 10/2013 | Kim et al. | |
| 2013/0277759 A1 | 10/2013 | Chen et al. | |
| 2013/0285153 A1 | 10/2013 | Lee et al. | |
| 2014/0001562 A1 | 1/2014 | Liaw | |
| 2014/0183600 A1 | 7/2014 | Huang et al. | |
| 2014/0252428 A1 * | 9/2014 | Chang .................. H01L 29/7851 257/288 |
| 2014/0264590 A1 | 9/2014 | Yu et al. | |
| 2014/0264592 A1 | 9/2014 | Oxland et al. | |
| 2014/0315371 A1 * | 10/2014 | Cai .................. H01L 21/76229 438/424 |
| 2015/0091127 A1 | 4/2015 | Lee et al. | |
| 2015/0243509 A1 | 8/2015 | Chan et al. | |
| 2015/0279959 A1 | 10/2015 | Qi et al. | |
| 2016/0056045 A1 | 2/2016 | Huang et al. | |
| 2016/0329248 A1 | 11/2016 | Liou et al. | |
| 2016/0336234 A1 | 11/2016 | Kim et al. | |
| 2017/0005102 A1 | 1/2017 | Feng et al. | |
| 2017/0154883 A1 | 6/2017 | Cheng et al. | |
| 2018/0122903 A1 | 5/2018 | Cheng et al. | |

FOREIGN PATENT DOCUMENTS

| | | |
|---|---|---|
| JP | 2011009296 A | 1/2011 |
| KR | 20130120973 A | 11/2013 |
| WO | 2010150429 A1 | 12/2010 |

\* cited by examiner

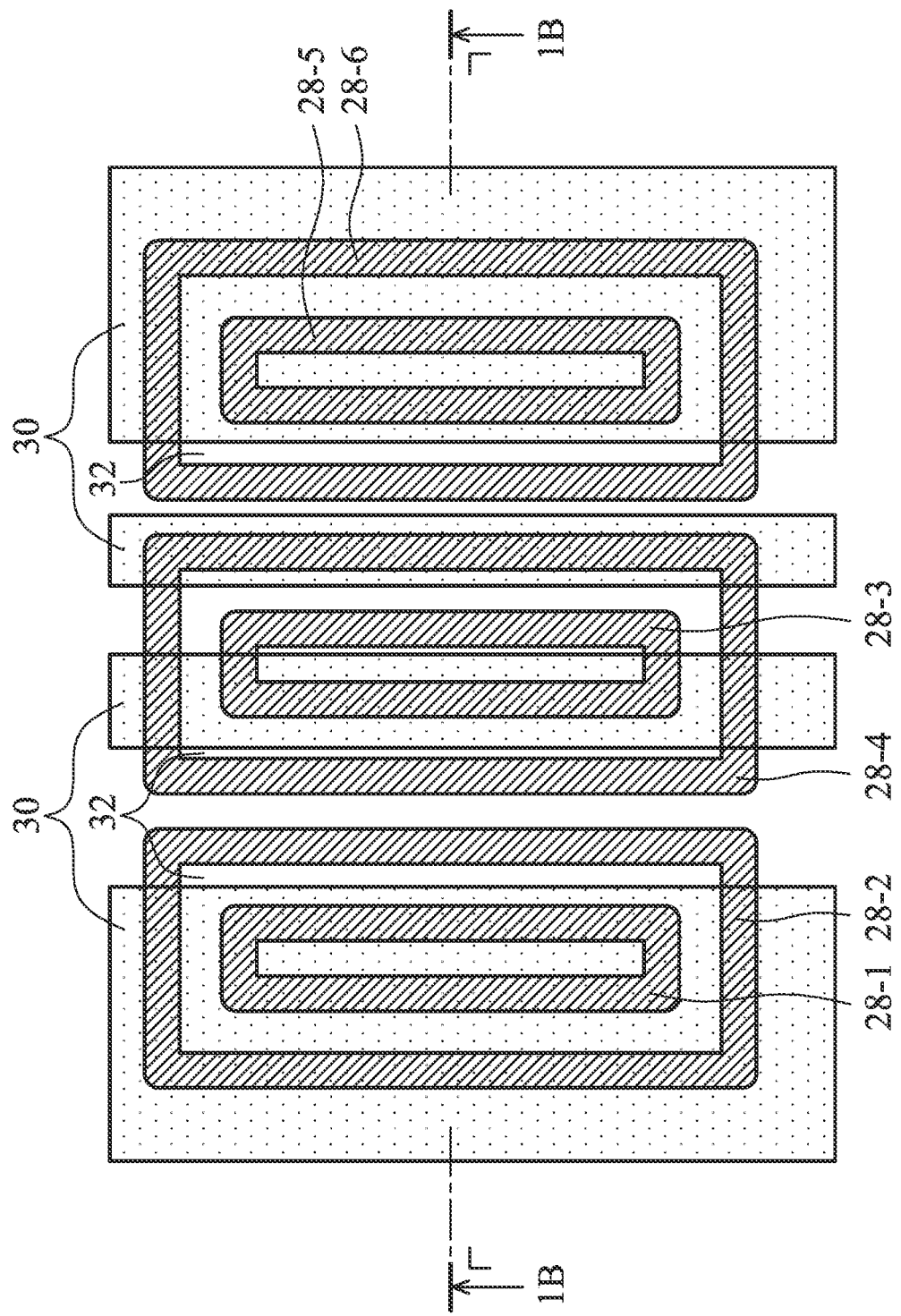

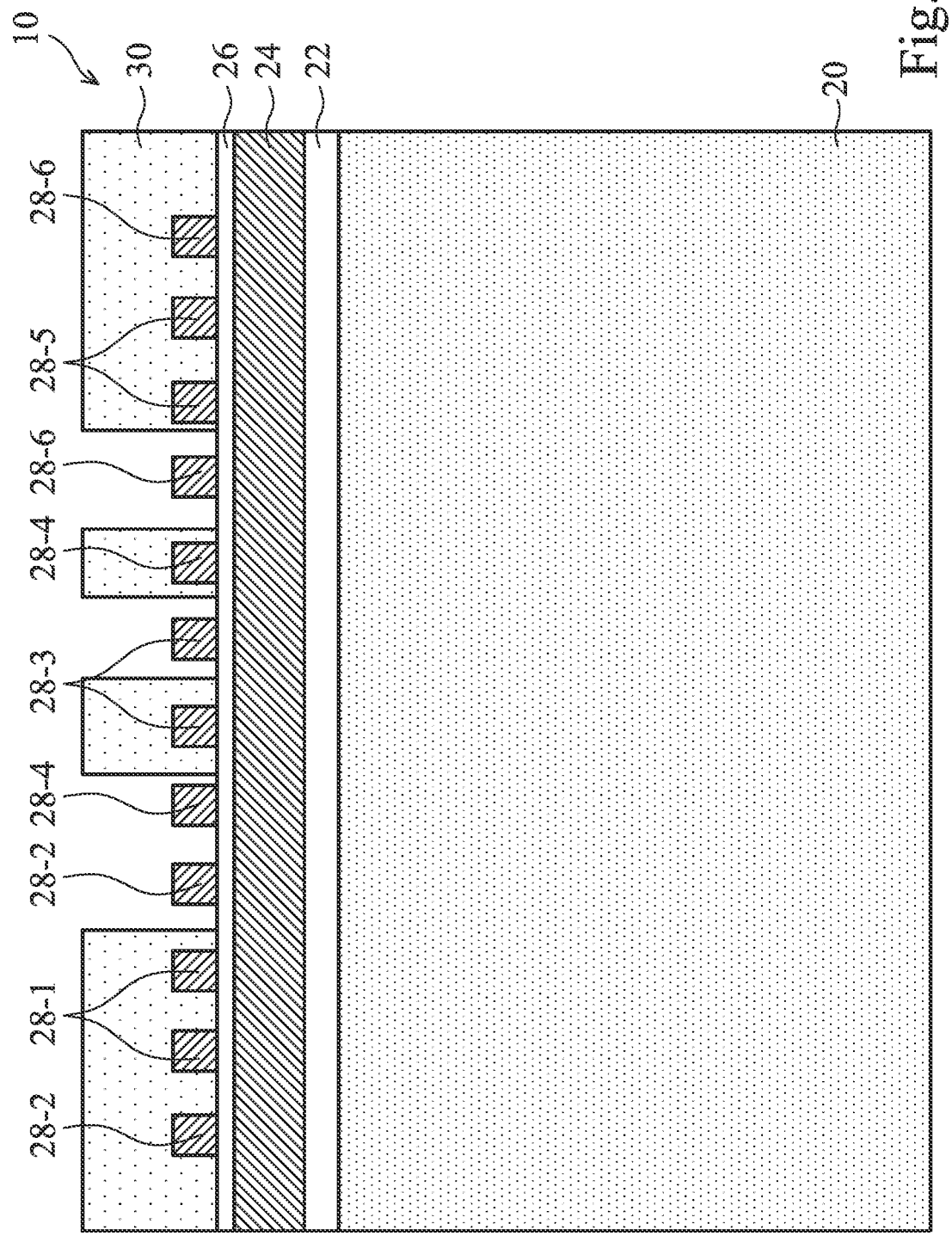

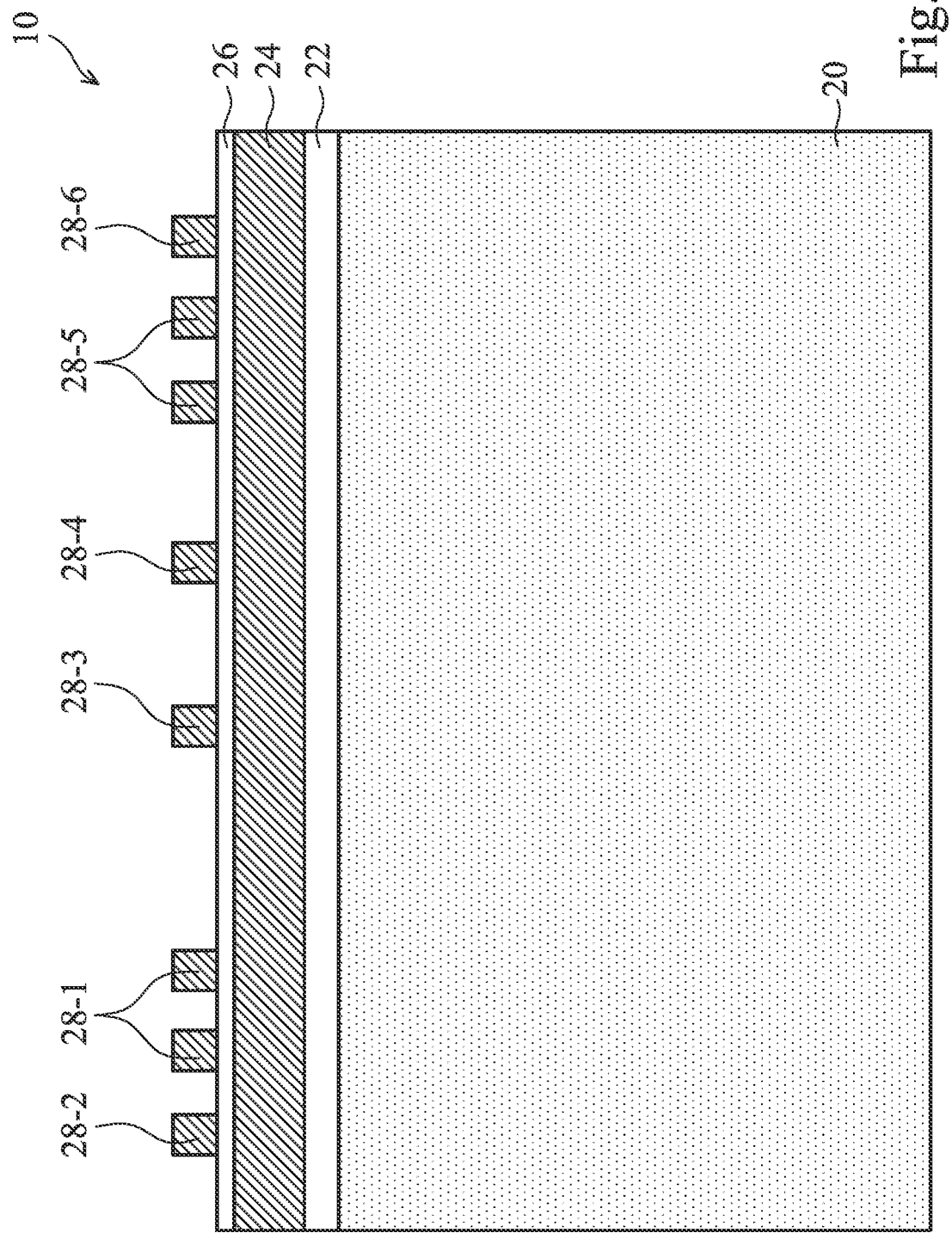

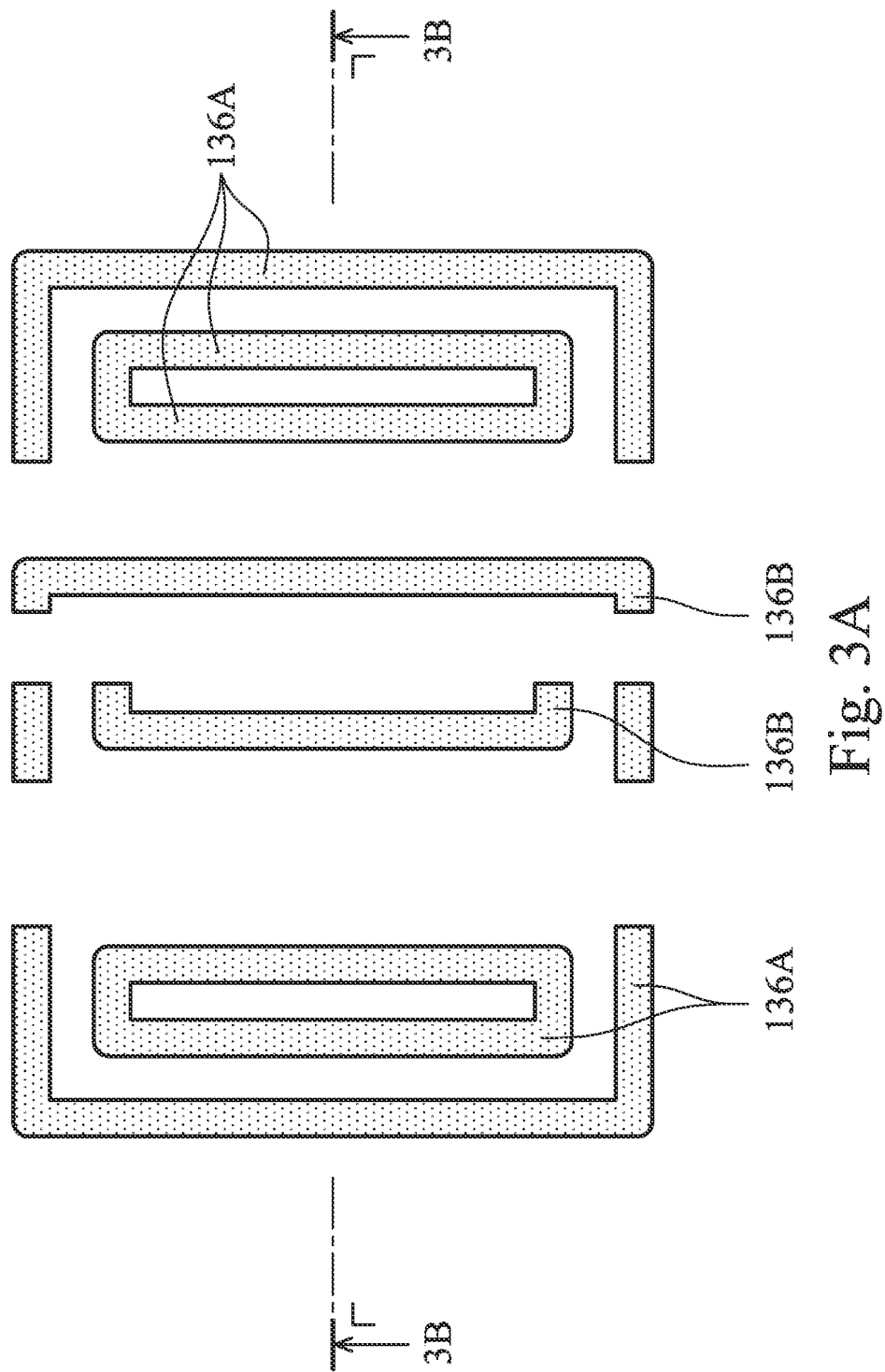

FIN STRUCTURE AND METHOD OF FORMING SAME THROUGH TWO-STEP ETCHING PROCESSES

PRIORITY CLAIM AND CROSS-REFERENCE

This application is a continuation of U.S. patent application Ser. No. 16/050,668, filed Jul. 31, 2018, and entitled "Fin Structure and Method of Forming Same Through Two-Step Etching Processes," which is a divisional of U.S. patent application Ser. No. 15/407,094, filed Jan. 16, 2017, and entitled "Fin Structure and Method of Forming Same Through Two-Step Etching Processes," now U.S. Pat. No. 10,217,741 issued Feb. 26, 2019, which claims the benefit of the U.S. Provisional Application No. 62/370,553, filed Aug. 3, 2016, and entitled "Fin Structure and Method of Forming Same," and Application No. 62/405,670, filed Oct. 7, 2016, and entitled "Fin Structure and Method of Forming Same," which applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semi-conductive layers of material over a semiconductor substrate, and patterning the various material layers using lithography to form circuit components and elements thereon.

A transistor is an element that is used often in semiconductor devices. There may be a large number of transistors (e.g. hundreds of, thousands of, or millions of transistors) on a single integrated circuit (IC), for example. A common type of transistor used in semiconductor device fabrication is a metal oxide semiconductor field effect transistor (MOSFET), as an example. A planar transistor (e.g. planar MOSFET) typically includes a gate dielectric disposed over a channel region in a substrate, and a gate electrode formed over the gate dielectric. A source region and a drain region of the transistor are formed on either side of the channel region.

Multiple Gate Field-Effect Transistors (MuGFETs) are a recent development in semiconductor technology. One type of MuGFET is referred to as a Fin Field-Effect Transistor (FinFET), which is a transistor that includes a fin-shaped semiconductor material raised vertically out of the semiconductor surface of an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 1B, 2A, 2B, 3A, 3B, 4-7, 8A, 8B, 9A, 9B, 10-11, 12A, 12B, and 13 illustrate top views and cross-sectional views of various intermediate stages of fabrication of a Fin Field-Effect Transistor (FinFET) in accordance with some embodiments.

DETAILED DESCRIPTION

Figure 2A:
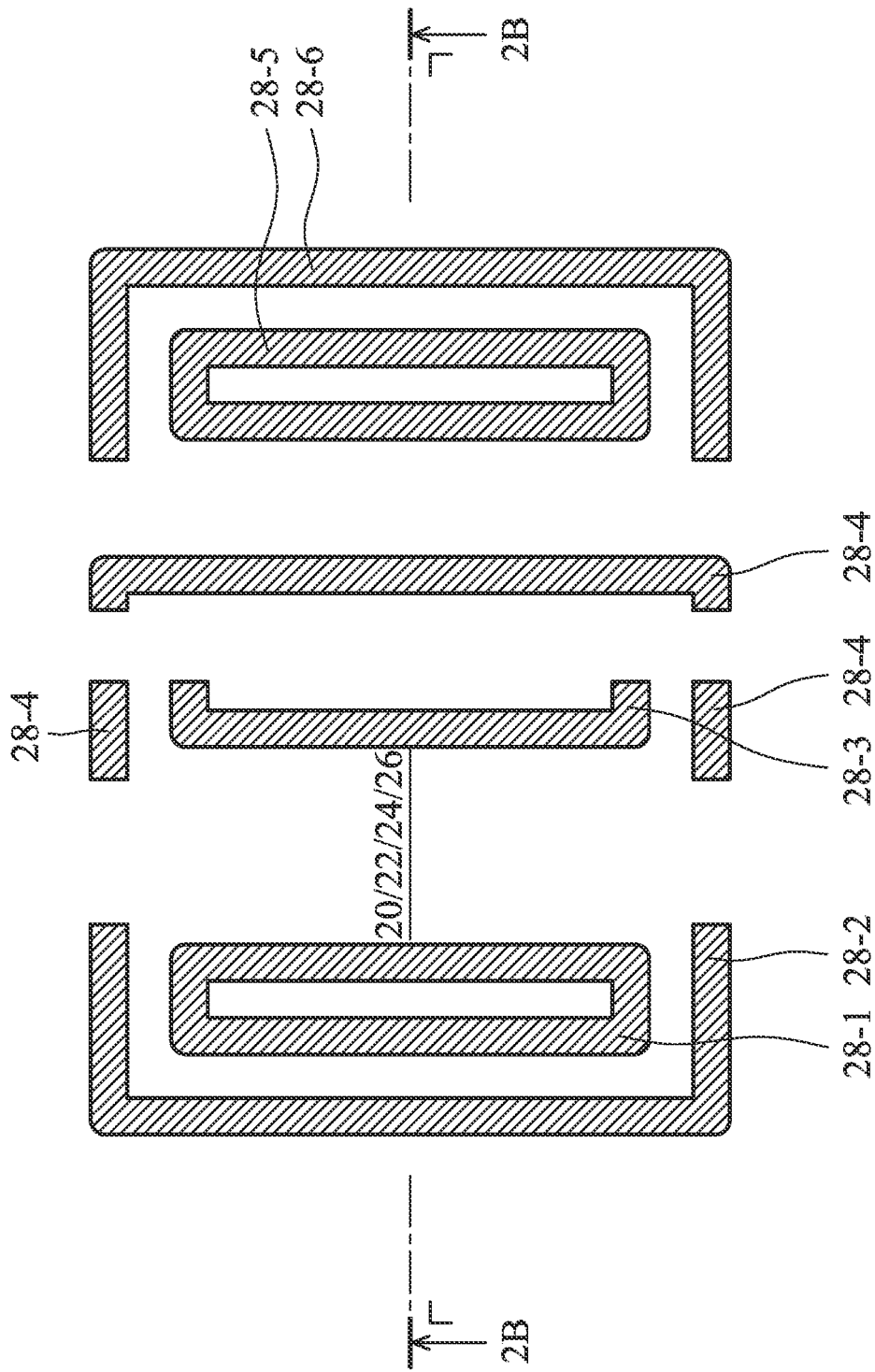

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and the method of forming the same are provided in accordance with various exemplary embodiments. The intermediate stages of forming the FinFETs are illustrated in accordance with some embodiments. Some variations of some embodiments are discussed. Throughout the various views and illustrative embodiments, like reference numbers are used to designate like elements.

Figure 17:
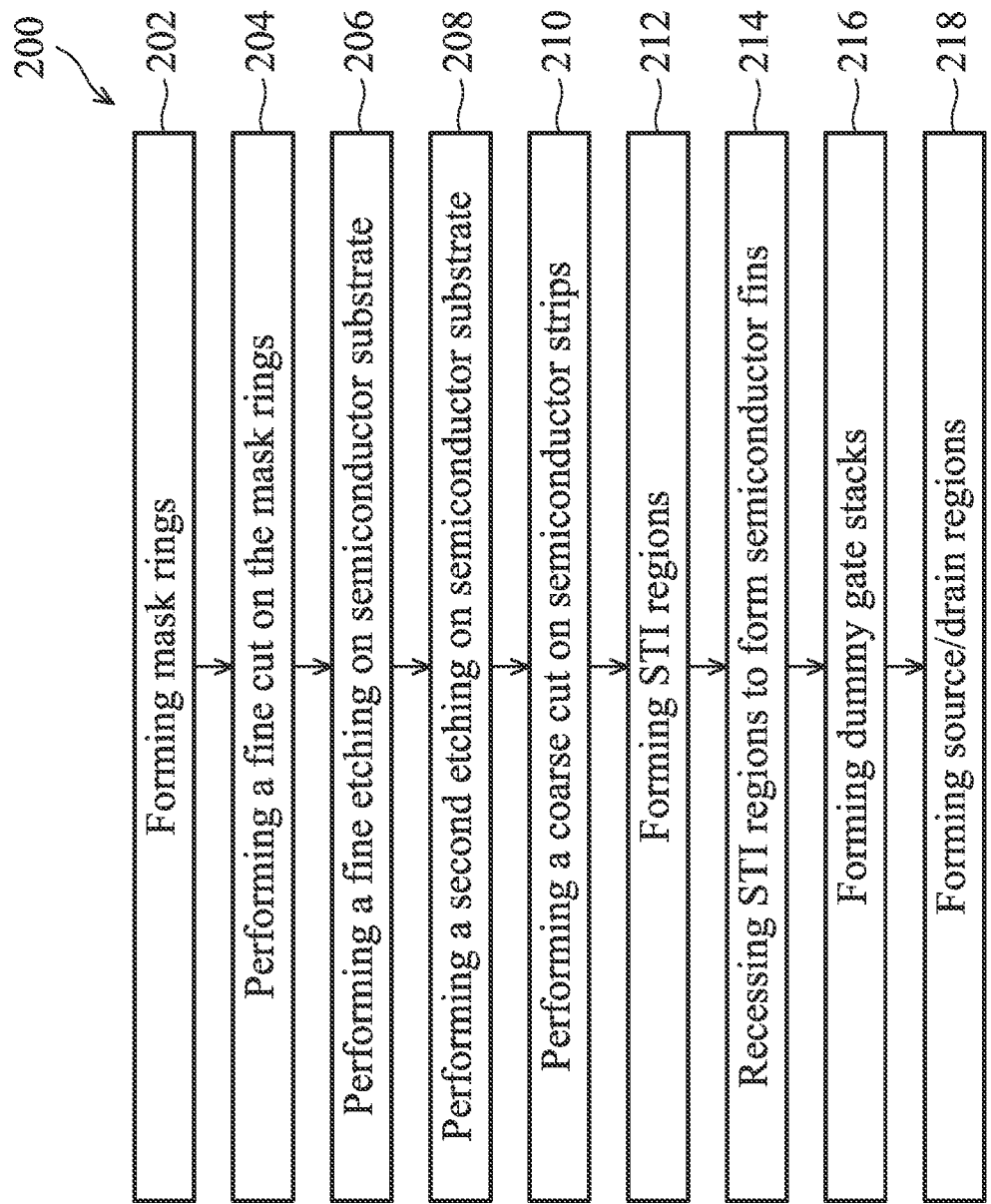
FIG. 17 illustrates a process flow for forming a FinFET in accordance with some embodiments.

FIGS. 1A through 13 illustrate the top views and cross-sectional views of intermediate stages in the formation of FinFETs in accordance with some embodiments of the present disclosure. The steps shown in FIGS. 1A through 13 are also reflected schematically in the process flow shown in FIG. 17. When two Figures have the same reference number, with one followed by letter "A", and the other followed by letter "B", the Figure with the reference number followed by letter "A" illustrates a top view, and the Figure with the reference number followed by letter "B" illustrates a cross-sectional view of the same structure.

FIG. 1B illustrates a cross-sectional view of wafer 10, which includes substrate 20. Substrate 20 may be a bulk substrate or a semiconductor-on-insulator substrate. In accordance with some embodiments of the present disclosure, substrate 20 is formed of a semiconductor material selected from, and not limited to, silicon germanium, silicon carbon, germanium, and III-V compound semiconductor materials such as GaAsP, AlInAs, AlGaAs, GaInAs, GaInP, GaInAsP, and the like. Substrate 20 may be lightly doped with a p-type or an n-type impurity.

Pad oxide 22 and hard mask 24 are formed over semiconductor substrate 20. In accordance with some embodiments of the present disclosure, pad oxide 22 is formed of silicon oxide, which may be formed by oxidizing a surface layer of semiconductor substrate 20. Hard mask 24 may be formed of silicon nitride, silicon oxynitride, silicon carbide, silicon carbo-nitride, or the like. In accordance with some embodiments of the present disclosure, hard mask 24 is formed of silicon nitride, for example, using Low-Pressure Chemical Vapor Deposition (LPCVD). In accordance with alternative embodiments of the present disclosure, hard mask 24 is formed by thermal nitridation of silicon, Plasma Enhanced Chemical Vapor Deposition (PECVD), or plasma anodic nitridation.

Oxide layer 26, which may be formed of silicon oxide, is formed over hard mask 24. In accordance with some embodiments of the present disclosure, oxide layer 26 is formed of silicon oxide. A plurality of mask rings 28-1, 28-2, 28-3, 28-4, 28-5, and 28-6 (collectively referred to as mask rings 28) are formed over oxide layer 26. The respective step is illustrated as step 202 in the process flow shown in FIG. 17. Mask rings 28 may be formed of silicon nitride, silicon oxynitride, silicon carbide, or the like.

FIG. 1A illustrates a top view of the mask rings 28 as shown in FIG. 1B. The structure shown in FIG. 1B is obtained from the plane containing line 1B-1B in FIG. 1A. As shown in FIG. 1A, outer mask rings 28-2, 28-4, and 28-6 encircle the inner mask rings 28-1, 28-3, and 28-5, respectively. In accordance with some embodiments of the present disclosure, the formation of mask rings 28 includes forming three mandrel rings (not shown), each in one of regions 32, forming a blanket spacer layer on the mandrel rings, and then performing an anisotropic etch to remove the horizontal portions of the blanket spacer layer. The remaining portions of the blanket spacer layer are thus mask rings 28. Inner mask rings 28-1, 28-3, and 28-5 are formed on the inner sides of the respective mandrel rings, and outer mask rings 28-2, 28-4, and 28-6 are formed on the outer sides of the respective mandrel rings. The mandrel rings are then removed, leaving the mask rings 28 as shown in FIGS. 1A and 1B.

FIGS. 1A and 1B also illustrate the formation and the patterning of photo resist 30, which covers some portions of mask rings 28, and leaving other parts of mask rings 28 exposed. Although photo resist 30 is illustrated as being a single-layer photo resist in FIG. 1B, photo resist 30 may also be replaced with a tri-layer including an under layer formed of a photo resist, a middle layer formed of an inorganic material, and an upper layer formed of another photo resist.

Next, the exposed portions of mask rings 28 are etched in a first etching process, which is alternatively referred to as a fine cut for defining the locations and sizes of semiconductor fins that will be formed in subsequent steps. The respective step is illustrated as step 204 in the process flow shown in FIG. 17. After the fine cut, photo resist 30 is removed. The resulting structure is shown in FIGS. 2A and 2B, which illustrate a top view and a cross-sectional view, respectively. The structure shown in FIG. 2B is obtained from the plane containing line 2B-2B in FIG. 2A. The remaining portions of the mask rings 28 are referred to as hard masks 28 hereinafter.

Figure 3B:
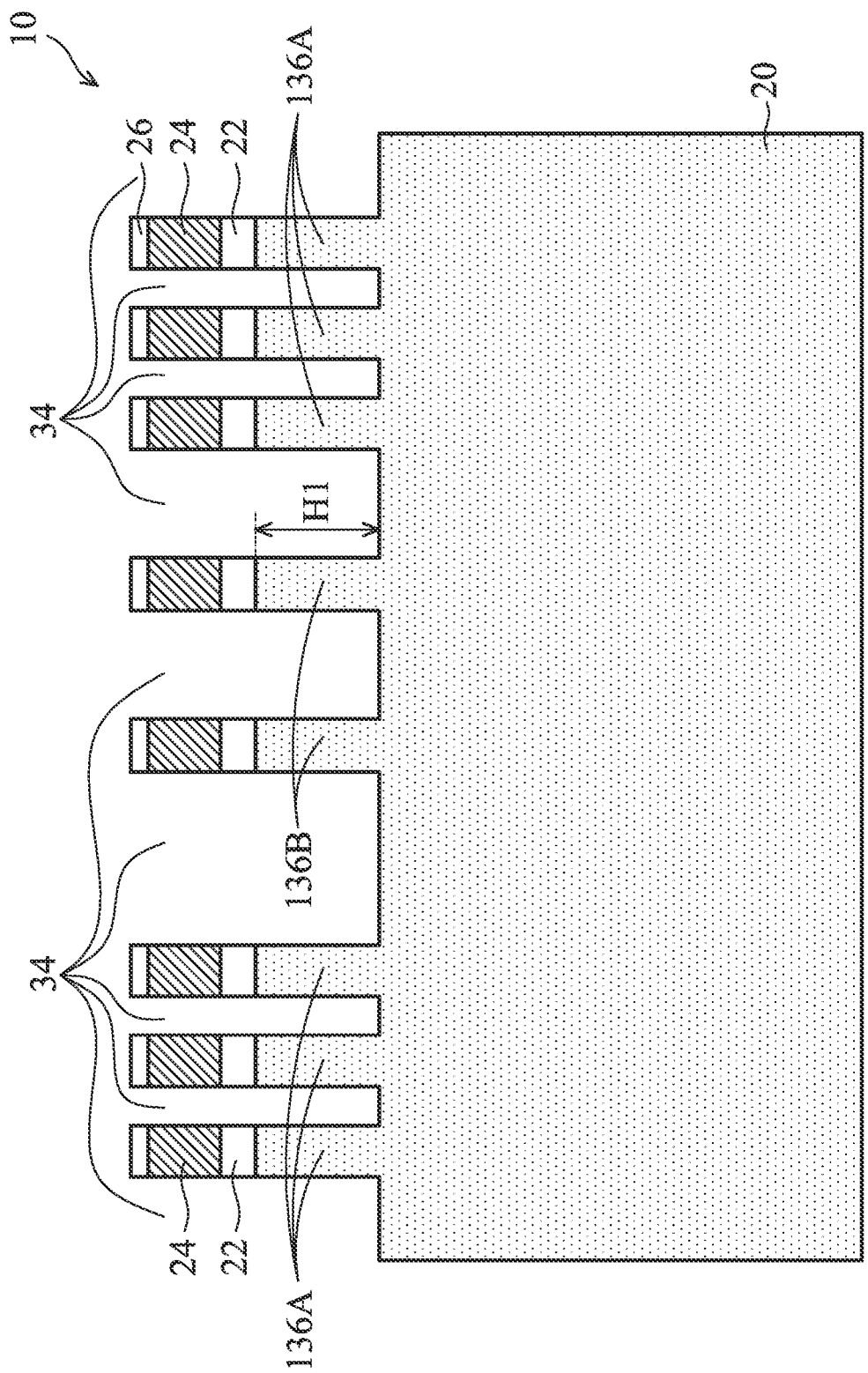

Next, as shown in FIGS. 3A and 3B, hard masks 28 are used to etch the underlying oxide layer 26, hard mask 24, pad oxide 22, and substrate 20. The structure shown in FIG. 3B is obtained from the plane containing line 3B-3B in FIG. 3A. The etching may be performed in two stages. For example, in the first stage, hard masks 28 (FIGS. 2A and 2B) are used as an etching mask to etch the underlying oxide layer 26 and hard mask 24, and the etching is stopped on the top surface of pad oxide layer 22. In the second stage, the patterned hard mask 24 is used as an etching mask to etch pad oxide layer 22 and semiconductor substrate 20. The respective step is illustrated as step 206 in the process flow shown in FIG. 17. In the resulting structure, as shown in FIG. 3B, trenches 34 are formed to extend into semiconductor substrate 20. Accordingly, semiconductor strips 136A and 136B are formed. In accordance with some embodiments of the present disclosure, some semiconductor strips 136A are closely located from each other to form a semiconductor strip group, while semiconductor strips 136B are spaced farther apart from each other than the strips 136A in the same strip group. In accordance with some embodiments of the present disclosure, the etching of substrate 20 is performed using a dry (anisotropic) etching method, wherein process gases such as $HBr/Cl_2/O_2$, $HBr/Cl_2/O_2$ $HBr/Cl_2/O_2/CF_2$, $C_2F_6$, $CF_4$, or the like may be used. It is appreciated that although FIG. 3B illustrates the sidewalls of semiconductor strips 136A and 136B are vertical, these sidewalls may be slanted, as will be discussed in detail referring to FIGS. 14, 15, and 16. In accordance with some embodiments, depth H1 (FIG. 3B) of trenches 34 is in the range between about 2 nm and about 800 nm.

Figure 4:
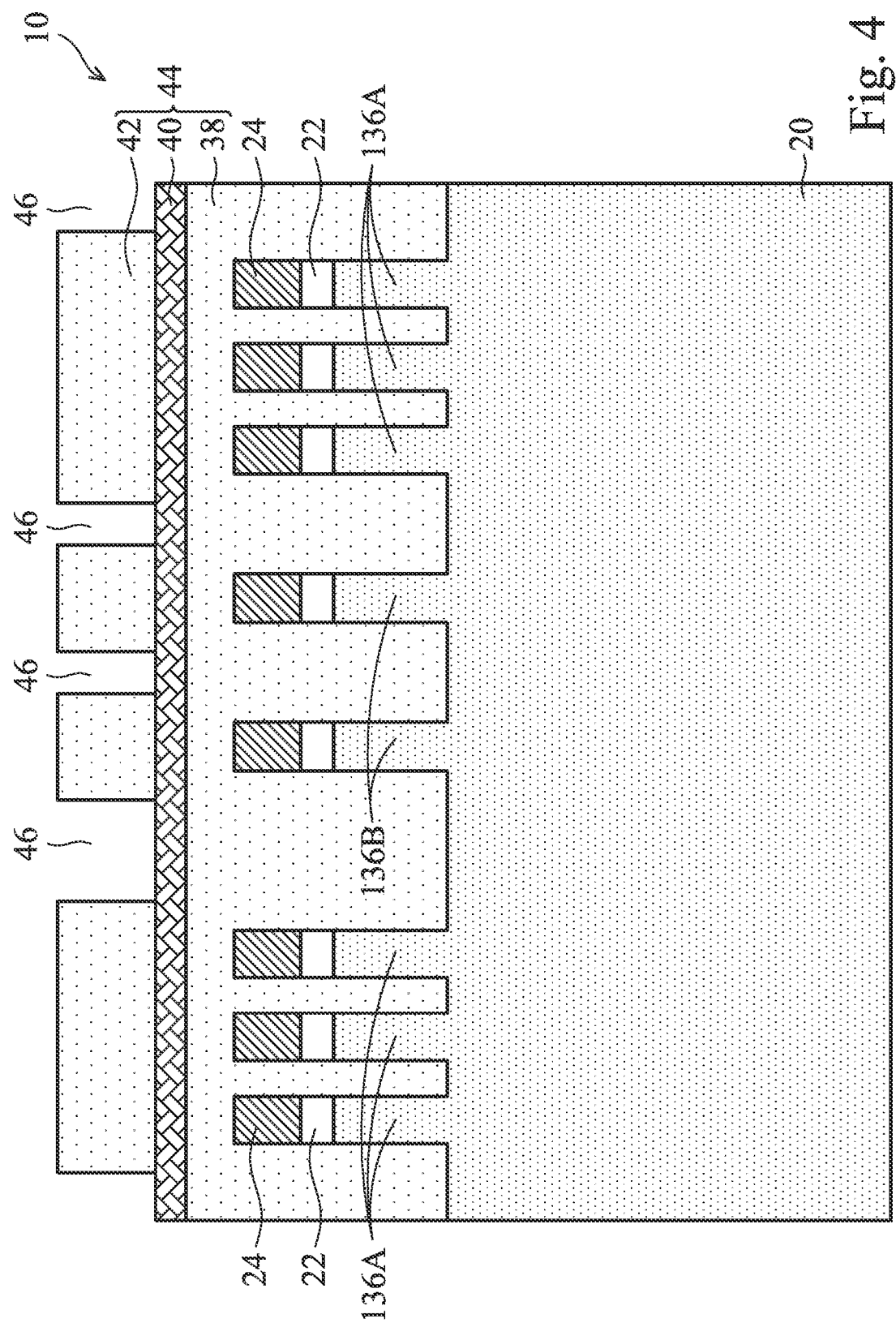

Referring to FIG. 4, a patterned lithography mask is formed. In accordance with some embodiments of the present disclosure, the patterned lithography mask includes tri-layer 44, which includes under layer (also known as a bottom layer) 38, middle layer 40 over under layer 38, and upper layer 42 over middle layer 40. In accordance with some embodiments of the present disclosure, under layer 38 and upper layer 42 are formed of photo resists. Middle layer 40 may be formed of an inorganic material, which may be a carbide (such as silicon oxycarbide), a nitride (such as silicon nitride), an oxynitride (such as silicon oxynitride), an oxide (such as silicon oxide), or the like. Upper layer 42 is patterned to cover strips 136A and 136B. In accordance with some embodiments, each patterns of the patterned upper layer 42 overlaps one of strip groups 136A or one of discrete strips 136B. Furthermore, to leave some process margin, the patterned upper layer 42 extends beyond the edges of the respective underlying strip groups 136A and discrete strips 136B.

Figure 5:
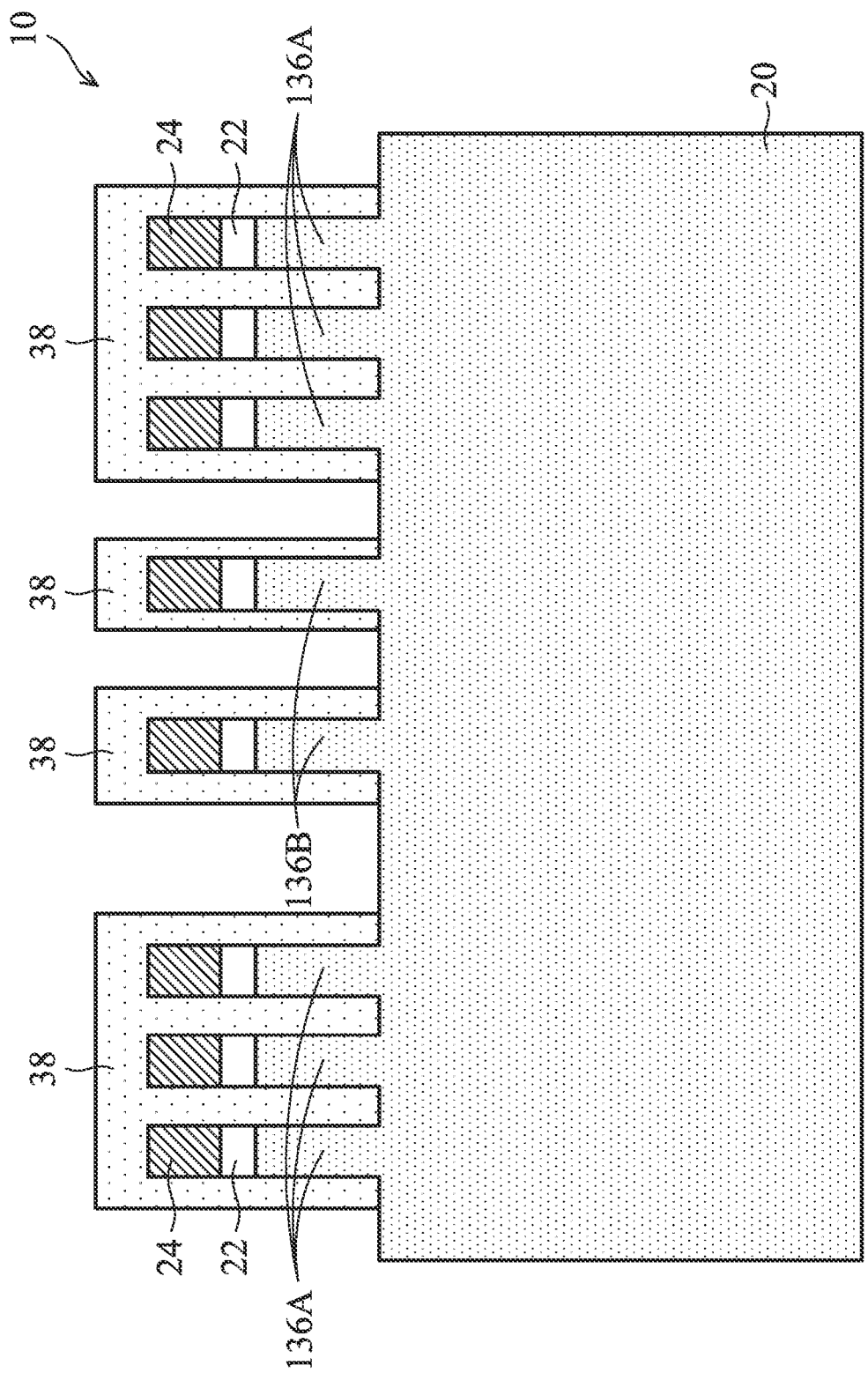

Next, an anisotropic etching is performed. Middle layer 40 is etched using the patterned upper layer 42 as an etching mask, so that the patterns of upper layer 42 are transferred into middle layer 40. During the patterning of middle layer 40, upper layer 42 is at least partially, or entirely, consumed. After middle layer 40 is etched through, under layer 38 is patterned anisotropically, wherein middle layer 40 is used as an etching mask. Upper layer 42 will also be fully consumed during the patterning of under layer 38 if it has not been fully consumed in the patterning of middle layer 40. The resulting structure is shown in FIG. 5.

Figure 6:
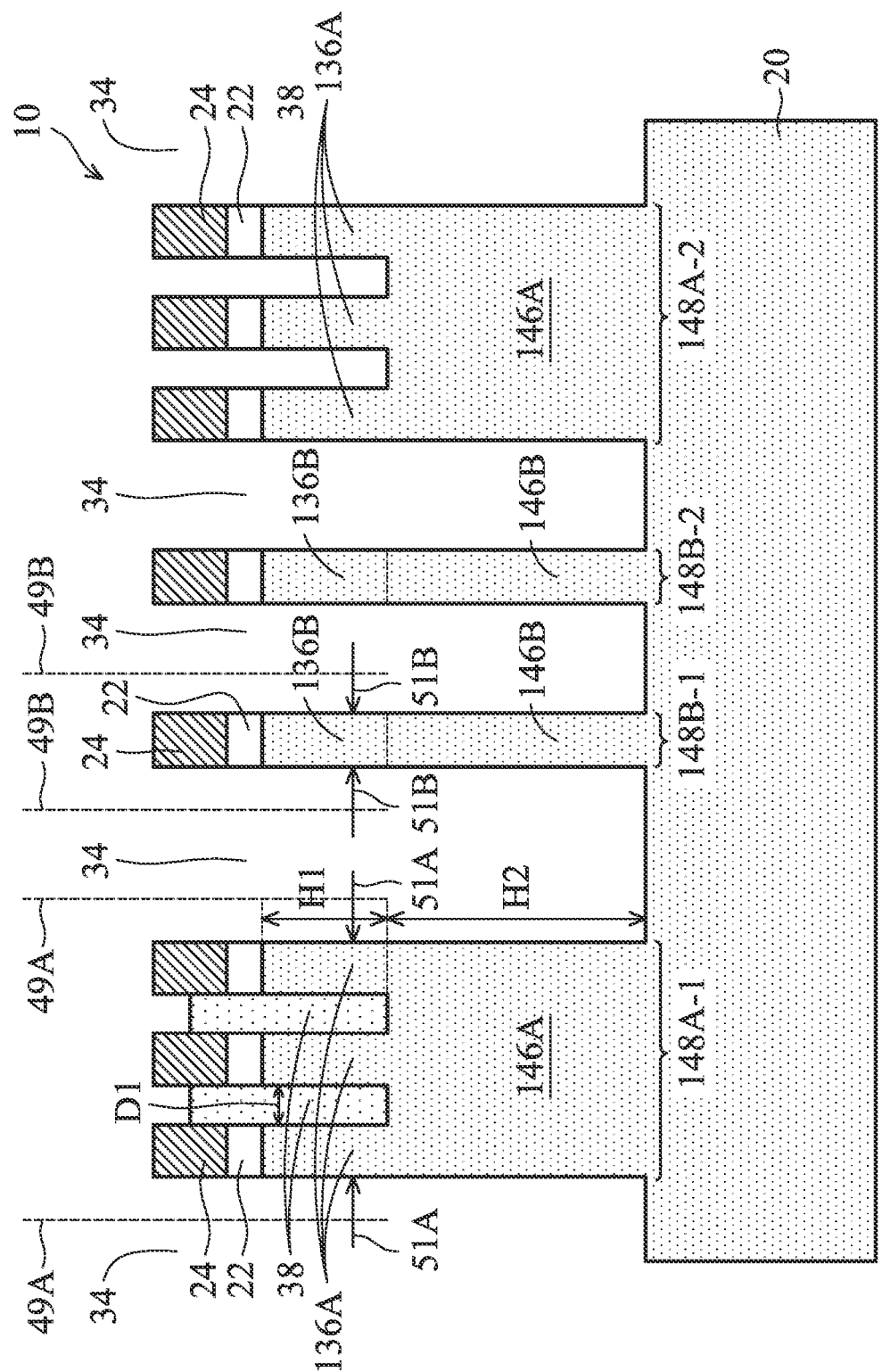
Figure 7:
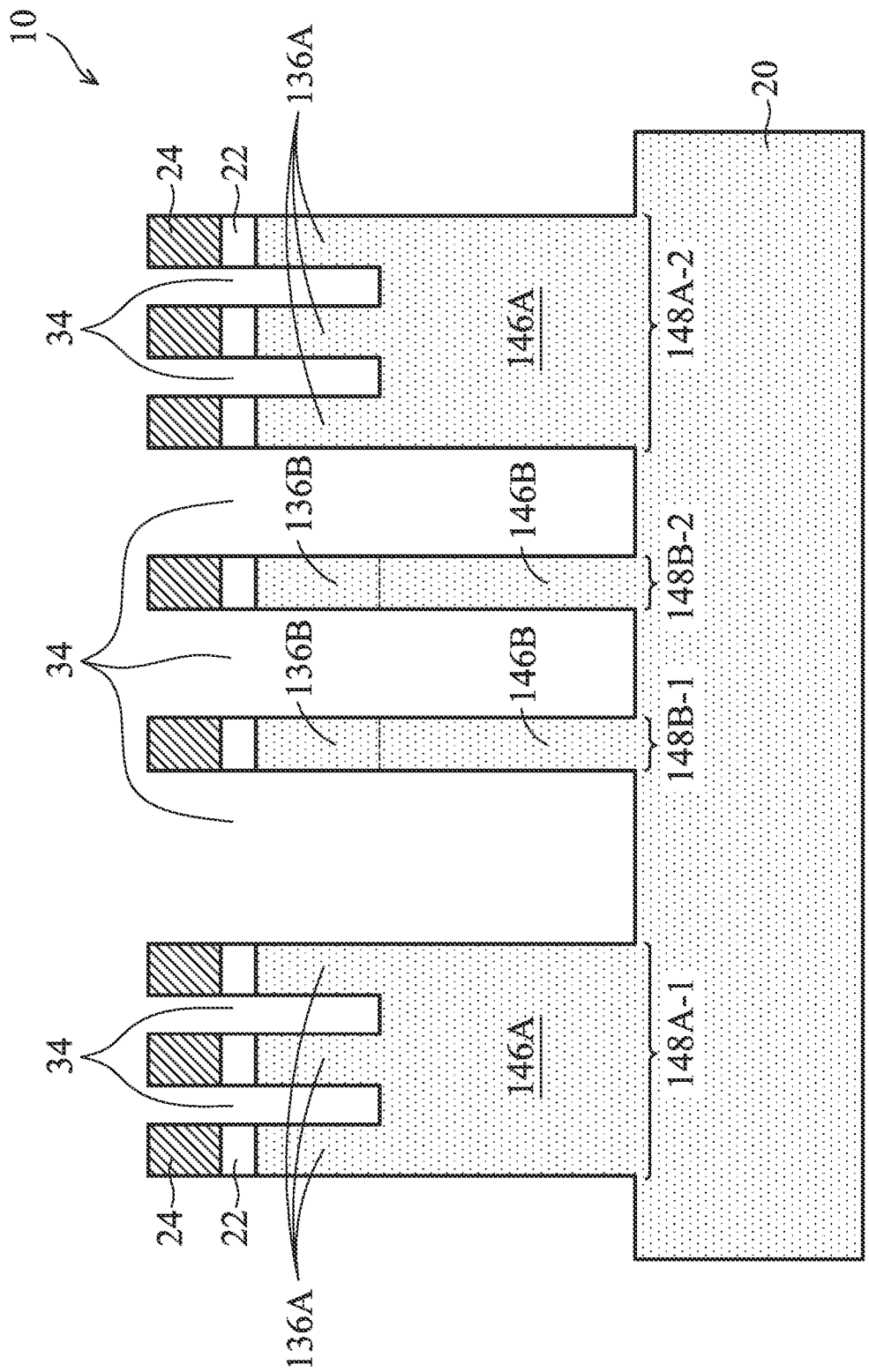

FIG. 6 illustrates the second etching process of semiconductor substrate 20 using the patterned under layer 38 as an etching mask. The respective step is illustrated as step 208 in the process flow shown in FIG. 17. Accordingly, semiconductor strips 148A (including 148A-1 and 148A-2) and 148B (including 148B-1 and 148B-2) are formed. Throughout the description, semiconductor strips 148A and 148B are collectively referred to as semiconductor strips 148. Trenches 34 further extend into semiconductor substrate 20, and separate semiconductor strips 148A and 148B from each other. In the top view of wafer 10, trenches 34 may have elongated portions having lengthwise directions parallel to each other. Furthermore, in the top view of wafer 10, each or some of semiconductor strips 148A and 148B may be encircled by respective trenches 34. In accordance with some embodiments of the present disclosure, depth H2 of the portions of trenches 34 formed in the second etching is in the range between about 3 nm and about 1,000 nm.

In accordance with some embodiments of the present disclosure, semiconductor strips 148A-1 and 148A-2 are referred to as crown-shaped semiconductor strips. Each of semiconductor strips 148A-1 and 148A-2 includes base 146A and semiconductor strips 136A over the respective bases 146A. Semiconductor strips 148B-1 and 148B-2 include lower portion 146B and the respective upper semiconductor strip 136B, wherein dashed lines are drawn to show where lower portions 146B are joined respective upper semiconductor strip 136B. Although FIG. 6 illustrates that there are three semiconductor strips 136A over one base 146A, the number of semiconductor strips 136A on each of the respective bases 146A may be any integer number such as 2, 4, 5, or more, depending on the designed drive currents of the resulting FinFETs.

In accordance with some embodiments, as shown in FIG. 6, during the etching of substrate 20, under layer 38 recesses laterally toward the center of the respective strip group 136A, and hence the outer edge of the outmost strip 136A in a strip group may be vertically aligned to the outer edge of the respective underlying base 146A. For example, under layer 38 may recess from the positions of lines 49A in the directions of arrows 51A toward the edges of the respective bases 146A, as shown in FIG. 6. Since strips 136A are close to each other, for example, with distances D1 smaller than about 20 nm, the portions of under layer 38 between strips 136A in the same strip group is consumed slowly, and are left to protect (along with hard mask 24) the underlying semiconductor substrate 20 from being etched. Accordingly, bases 146A are formed. In accordance with alternative embodiments, bases 146A extend laterally beyond the outer edges of the outmost strips 136A when the lateral recessing of under layer 38 is not fast enough. The hard mask 24 over strips 136B also protects the underlying strips 136B and substrate 20, so that strip portions 146B are formed. Similarly, during the etching of substrate 20, under layer 38 recesses laterally from the position of line 49B in the direction of arrow 51B (toward the center of the respective strip 136B), and hence the outer edges of strip portion 136B may be vertically aligned to the outer edges of the respective underlying strip portions 146B. The gradual lateral recessing of under layer 38 (and the fact the second etching is deeper into substrate 20 than the first etching) during the etching also causes the edges of base 146A to be more slanted than the overlying strips 136A, and the edges of the strip portions 146B to be more slanted than the respective overlying portions 136B. The details will be shown and discussed referring to FIGS. 14 through 16.

Figure 8A:
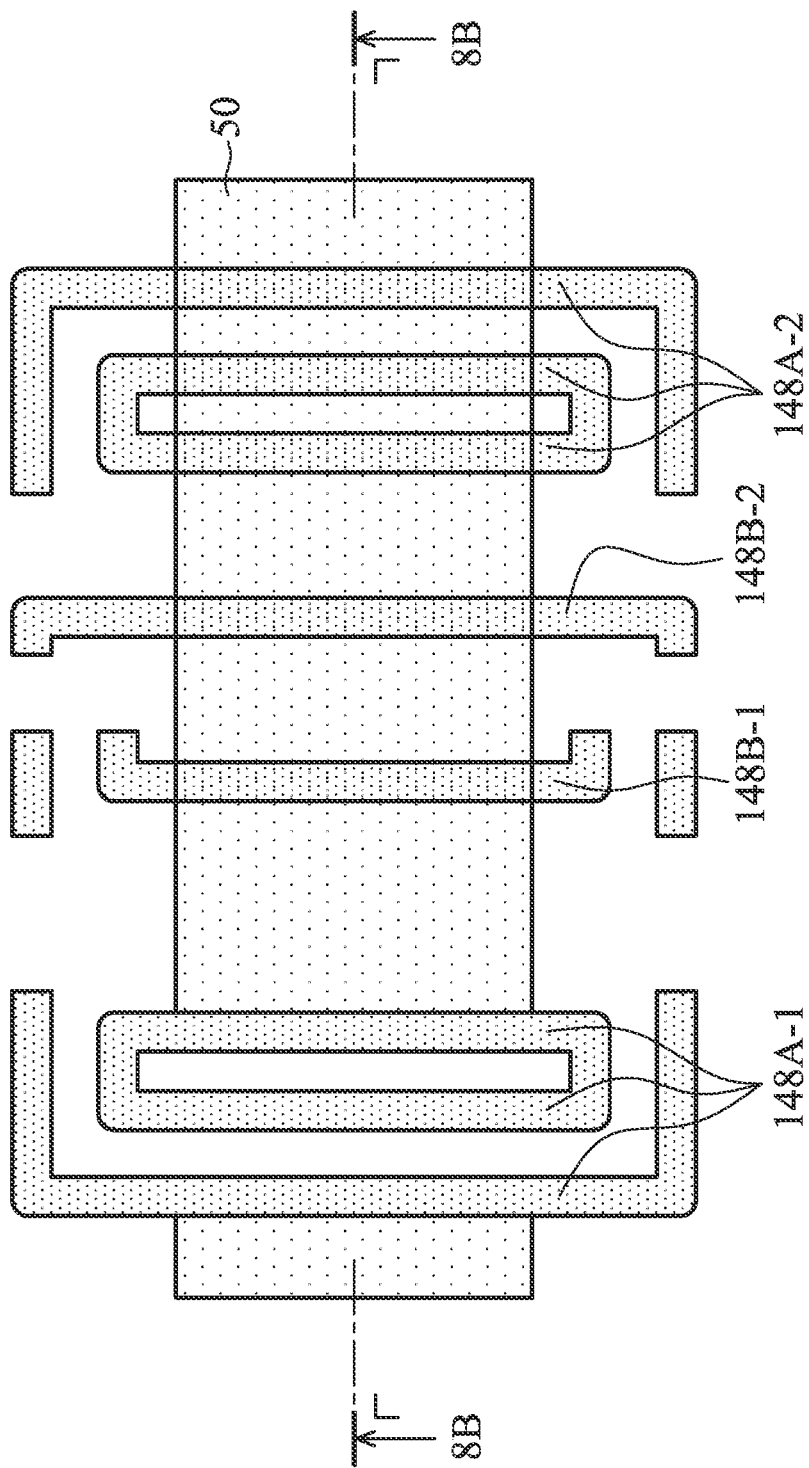
Figure 8B:
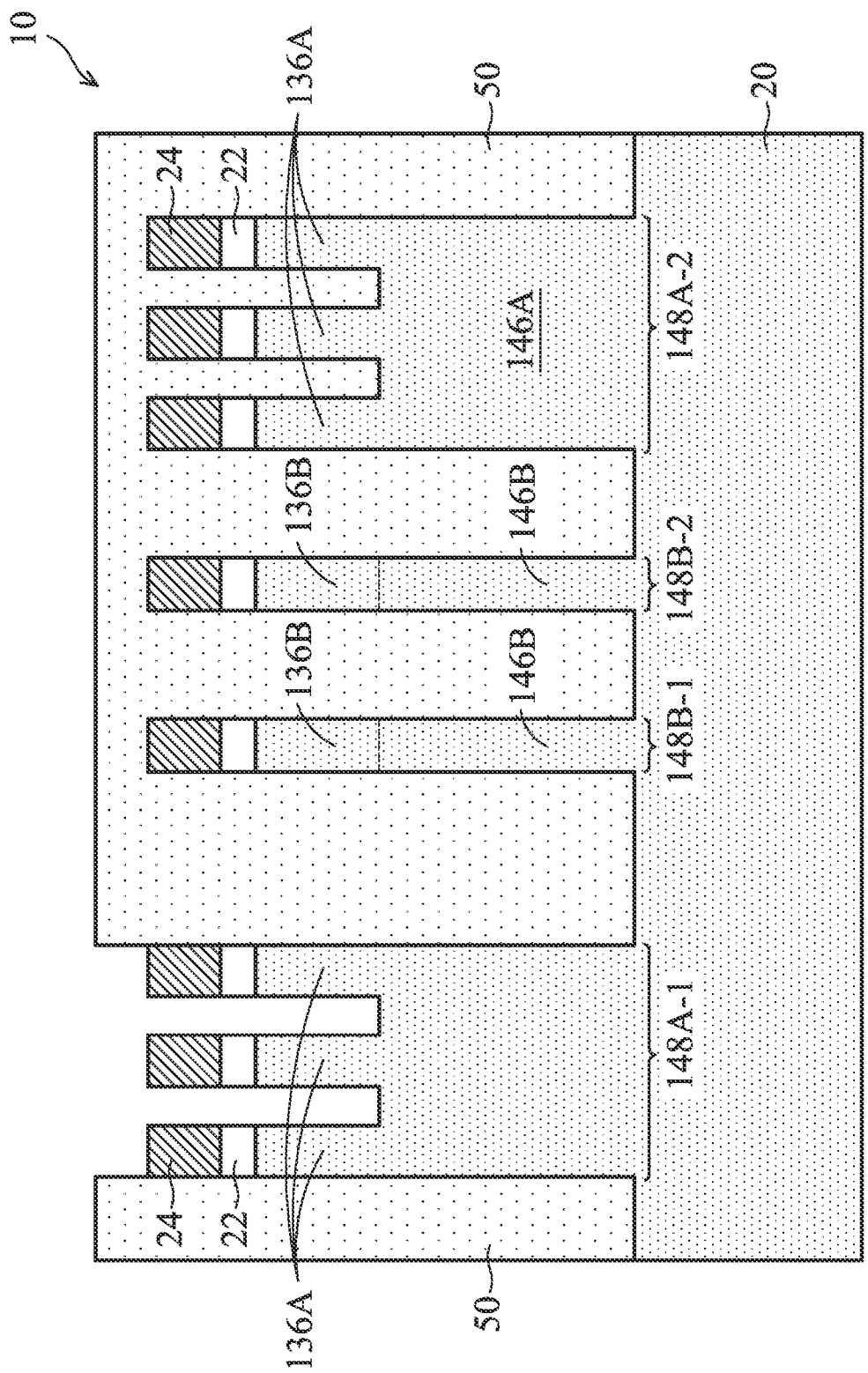
Figure 9A:
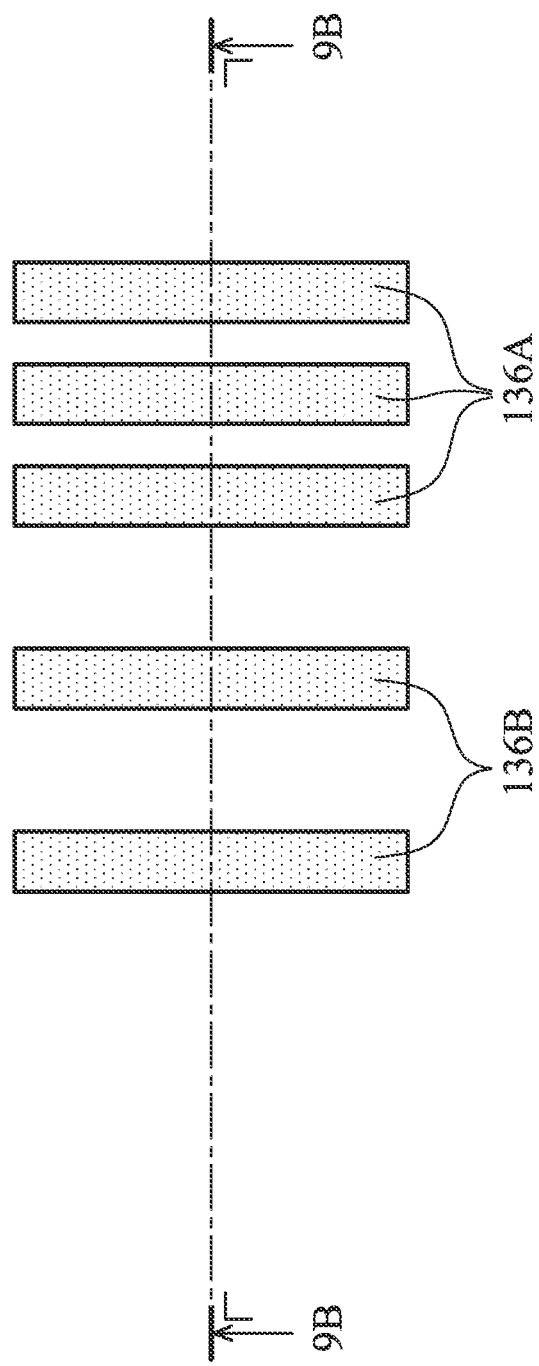
Figure 9B:
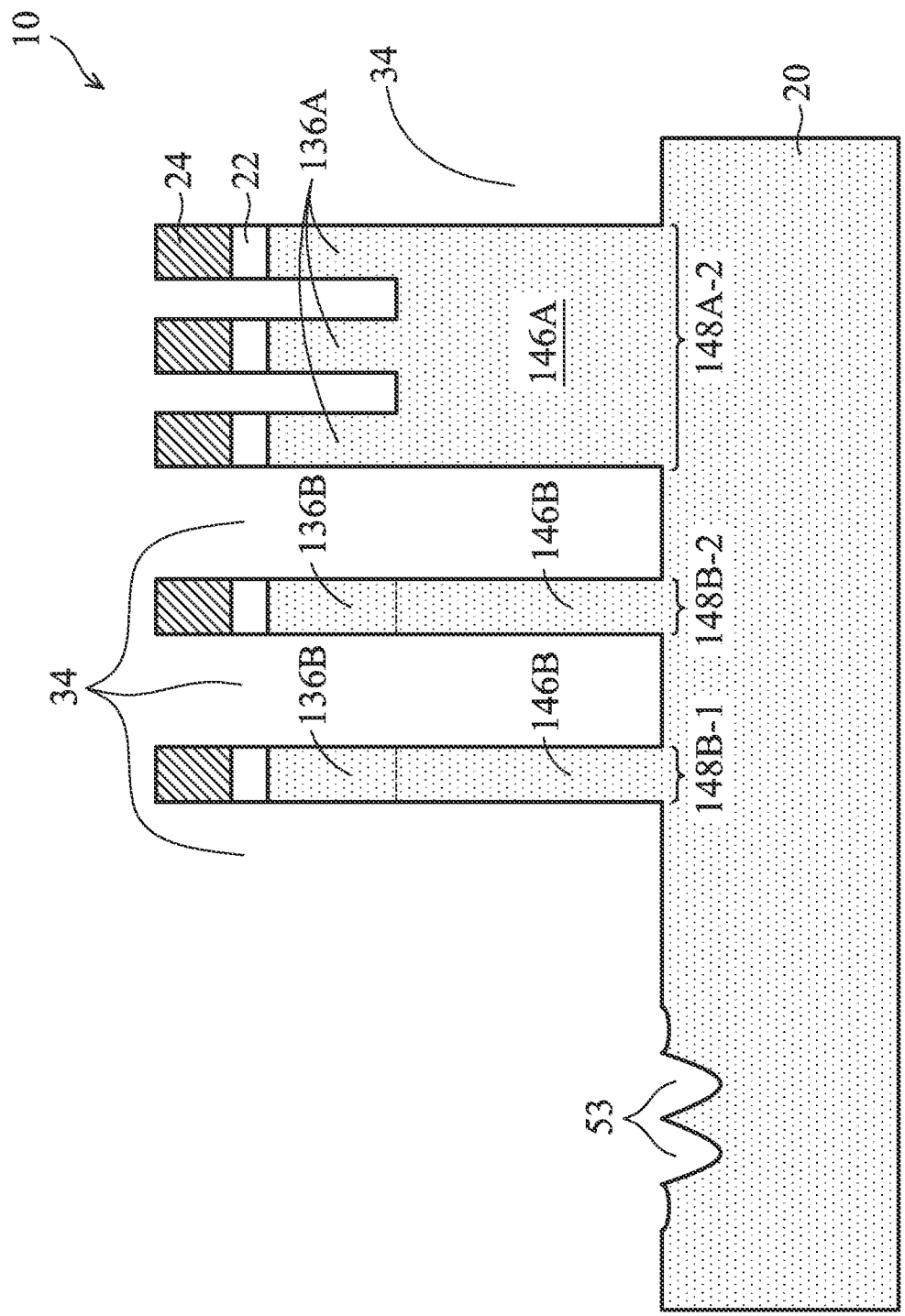

In accordance with some embodiments, depth (height) H1 of strips 136A and 136B is smaller than depth (height) H2 of strip base 146A and strip portion 146B. The ratio H1/H2 may be in the range between about 0.5 and about 0.8 in accordance with some embodiments. Next, the remaining under layer 38 is removed, and the resulting structure is shown in FIG. 7, FIGS. 8A, 8B, 9A, and 9B illustrate a coarse cut process for removing undesirable portions of semiconductor strips 148A and 148B. The respective step is illustrated as step 210 in the process flow shown in FIG. 17. For example, as shown in FIGS. 8A and 8B, photo resist 50 is formed. Photo resist 50 may also be replaced with a tri-layer. In accordance with some exemplary embodiments as shown in FIG. 8A, photo resist 50 covers the middle portions of semiconductor strips 148B-1, 148B-2, and crown-shaped strip 148A-2, while leaving the entirety of the crown-shaped semiconductor strip 148A-1 exposed. The structure shown in FIG. 8B is obtained from the plane containing line 8B-8B in FIG. 8A. The exposed portions of semiconductor strips 148A and 148B are then etched, followed by the removal of photo resist 50. The crown-shaped semiconductor strip 148A-1 may be fully removed, and hence is referred to as dummy (crown-shaped) strip 148A-1 hereinafter. The resulting structure is shown in FIGS. 9A and 9B, respectively, wherein the structure shown in FIG. 9B is obtained from the plane containing line 9B-9B in FIG. 9A.

As shown in FIG. 9B, the etching of dummy strip 148A-1 (FIG. 8B) may be continued after it is fully removed, so that recesses 53 (FIG. 9B) are formed to extend from the bottom level of strips 148B-1, 148B-2, and 148A-2 further down into semiconductor substrate 20. In accordance with some embodiments of the present disclosure, recesses 53 have a W-shape. When the number of strips 136A (FIG. 8B) is different from three, recesses 53 may have other shapes. Recesses 53 may help improve/change the stress in the resulting wafer 10, and is advantageous for the performance improvement of the devices. It is appreciated that when recesses 53 are formed, discrete semiconductor strips such as 148B-1 and 148B-2 may also be removed, and recesses may also be formed to extend lower than the bottoms of the removed strips 148B.

It is noted that although semiconductor strips 148A and 148B are shown as closely located to each other in accordance with some embodiments, they can also be located in different regions of a die in any combination. For example, semiconductor strips 148A may be in a first device region, and semiconductor strips 148B may be in a second device region separated from the first device region.

Figure 10:
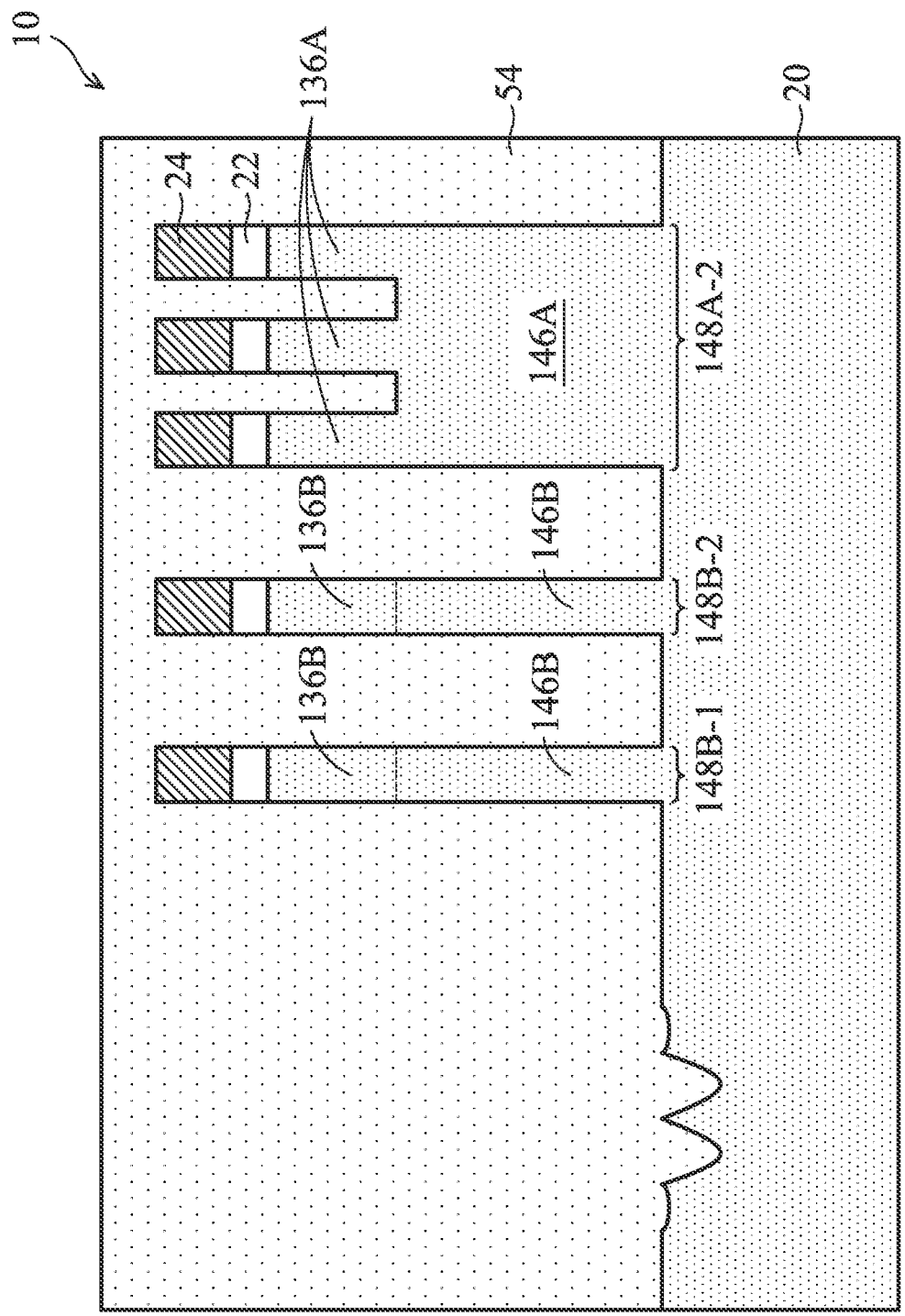

Next, referring to FIG. 10, dielectric region/material 54 is formed to fill trenches 34 as shown in FIG. 9B. In accordance with some embodiments of the present disclosure, dielectric region 54 includes a liner oxide and a dielectric material (not shown separately) over the liner oxide. The liner oxide may be formed as a conformal layer, whose horizontal portions and vertical portions have thicknesses close to each other. The thickness of the liner oxide may be in the range between about 10 Å and about 50 Å. In accordance with some embodiments of the present disclosure, the liner oxide is formed by oxidizing wafer 10 in an oxygen-containing environment, for example, through Local Oxidation of Silicon (LOCOS), wherein oxygen ($O_2$) may be included in the respective process gas. In accordance with other embodiments of the present disclosure, the liner oxide is formed using In-Situ Steam Generation (ISSG), for example, with water steam or a combined gas of hydrogen ($H_2$) and oxygen ($O_2$) used to oxidize the exposed semiconductor substrate 20 and semiconductor strips 148A and 148B. The ISSG oxidation may be performed at an elevated temperature. In accordance with yet other embodiments, the liner oxide is formed using a deposition technique such as Sub Atmospheric Chemical Vapor Deposition (SACVD).

The dielectric material is then formed to fill the remaining portions of trenches 34, resulting in the structure shown in FIG. 10. The dielectric material may be formed of silicon oxide, silicon carbide, silicon nitride, or multi-layers thereof. The formation method of the dielectric material may be selected from Flowable Chemical Vapor Deposition (FCVD), spin-on coating, Chemical Vapor Deposition (CVD), Atomic Layer Deposition (ALD), High-Density Plasma Chemical Vapor Deposition (HDPCVD), LPCVD, and the like.

In accordance with some embodiments in which FCVD is used, a silicon- and nitrogen-containing precursor (for example, trisilylamine (TSA) or disilylamine (DSA)) is used, and hence the resulting the dielectric material is flowable (jelly-like). In accordance with alternative embodiments of the present disclosure, the flowable dielectric material is formed using an alkylamino silane based precursor. During the deposition, plasma is turned on to activate the gaseous precursors for forming the flowable oxide. After the dielectric material is formed, an anneal/curing step is performed, which converts the flowable dielectric material into a solid dielectric material.

Figure 11:
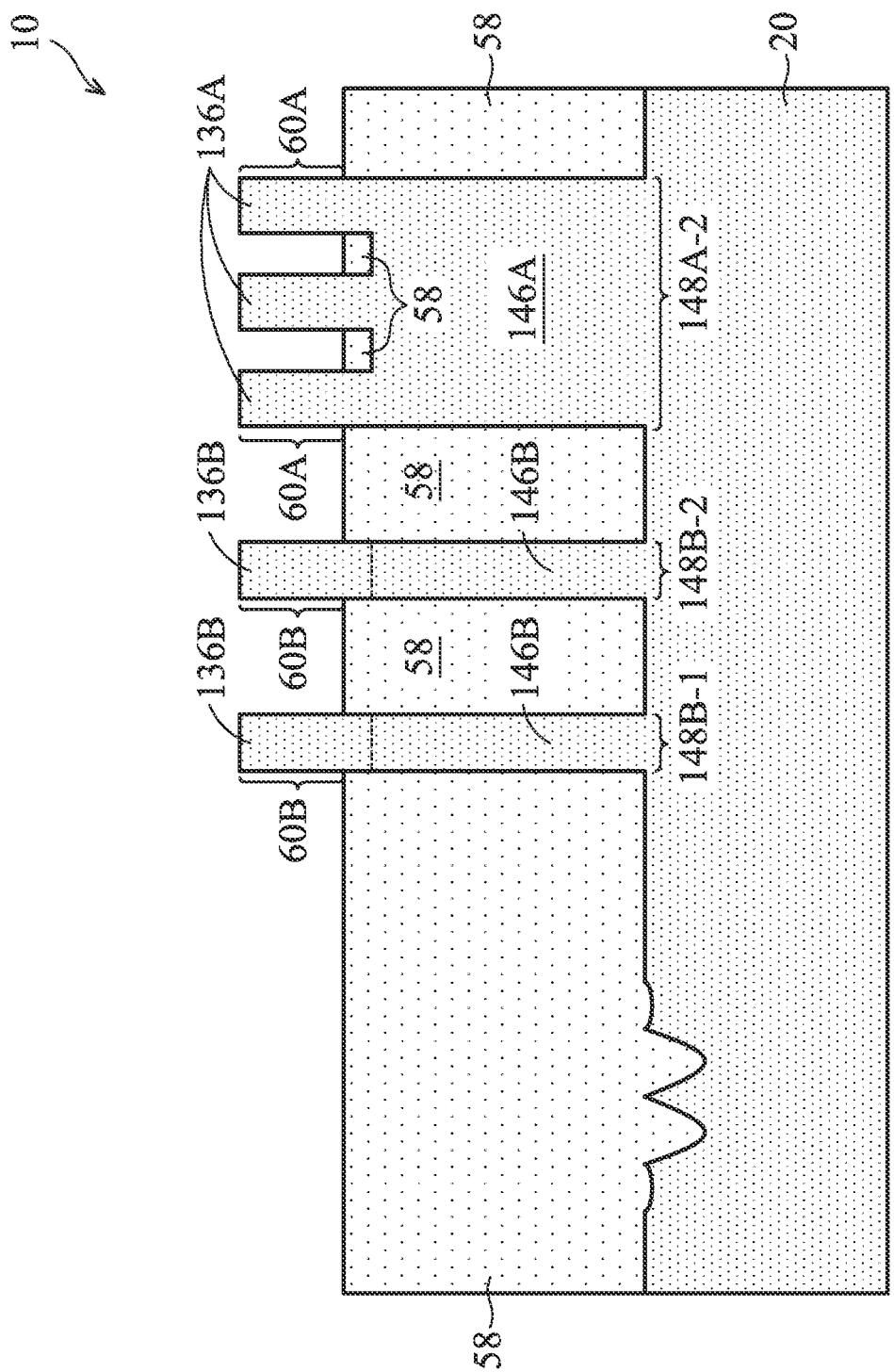

A planarization such as a Chemical Mechanical Polish (CMP) or mechanical grinding is then performed, until hard mask 24 is exposed. The remaining portions of isolation regions 54 are referred to as Shallow Trench Isolation (STI) regions 58, as shown in FIG. 11. The respective step is illustrated as step 212 in the process flow shown in FIG. 17. Hard mask 24 may be used as the CMP stop layer, and hence the top surfaces of hard mask 24 are substantially coplanar with the top surface of the STI regions.

Hard mask 24 (FIG. 10) is then removed. If formed of silicon nitride, hard mask 24 may be removed in a wet process using hot $H_3PO_4$ as an etchant. Next, as shown in FIG. 11, STI regions 58 are recessed, and pad layer 22 (FIG. 10) may also be removed in the same process. Accordingly, semiconductor fins 60A and 60B are generated. The respective step is illustrated as step 214 in the process flow shown in FIG. 17. The recessing of STI regions 58 may be performed using an isotropic etching process, which may be a dry etch process or a wet etch process. In accordance with some embodiments of the present disclosure, the recessing of STI regions 58 is performed using a dry etch method, in which the process gases including $NH_3$ and $NF_3$ are used. In accordance with alternative embodiments of the present disclosure, the recessing of STI regions 58 is performed using a wet etch method, in which the etchant solution is a diluted HF solution.

The recessing of STI regions 58 results in semiconductor fins 60A and 60B to protrude higher than the top surfaces of STI regions 58. In accordance with some embodiments of the present disclosure, the portions of STI regions 58 directly over base 146A have some portions left, and the top surfaces of remaining STI regions 58 is higher than the top surface of base 146A. In accordance with alternative embodiments of the present disclosure, the portions of STI regions 58 directly over base 146A are removed, and the top surfaces of remaining STI regions 58 are substantially coplanar with, or slightly lower than, the top surface of base 146A.

Figure 12A:
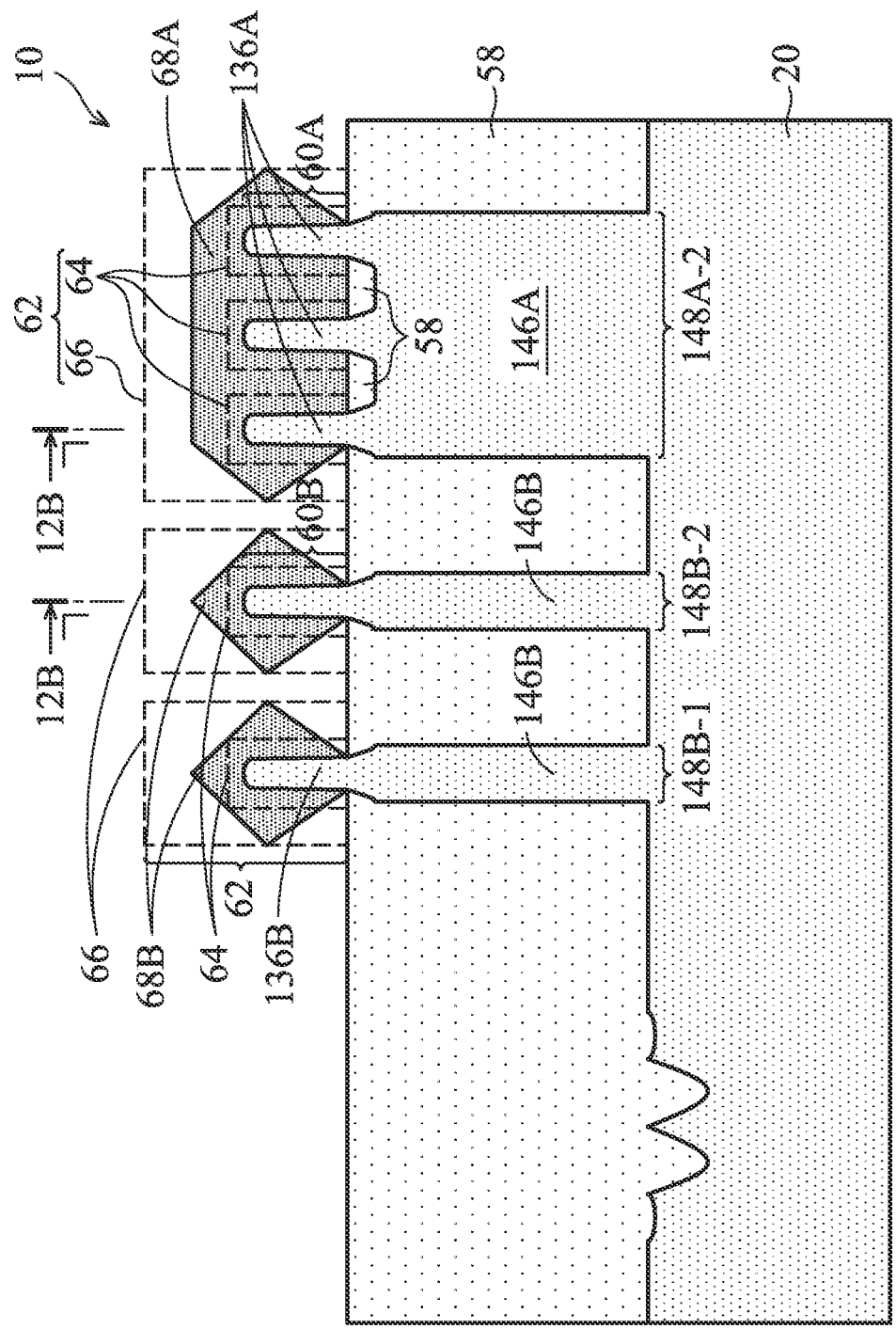
Figure 12B:
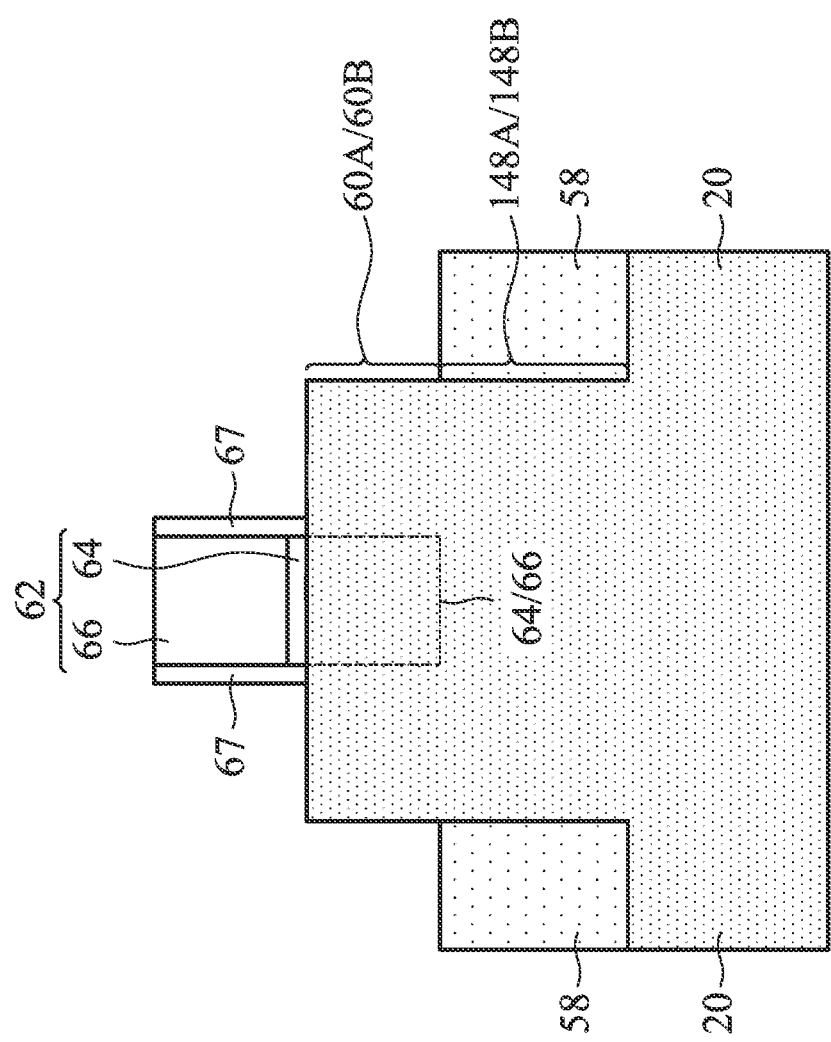

FIG. 12A illustrates the formation of dummy gate stacks 62 in accordance with some embodiments of the present disclosure. The respective step is illustrated as step 216 in the process flow shown in FIG. 17. Dummy gate stacks 62 may include dummy gate dielectric 64 and dummy gate electrode 66 over dummy gate dielectric 64. Dummy gate dielectric 64 may be formed of silicon oxide. Dummy gate electrode 66 may be formed of polysilicon in accordance with some embodiments. FIG. 12B illustrates a cross-sectional view of the structure shown in FIG. 12A, wherein the cross-sectional view may be obtained from the vertical plane containing either one of the lines 12B-12B in FIG. 12A. As shown in FIGS. 12A and 12B, dummy gate stacks 62 are formed on the sidewalls and the top surfaces of the respective semiconductor fins 136A or 136B, with some other portions of semiconductor fins 60A and 60B exposed. Gate spacers 67 are formed on the sidewalls of dummy gate stacks 62.

Next, the exposed portions of semiconductor fins 60A and 60B (FIG. 12B) not covered by dummy gate stacks 62 may be removed in an etching process. After the etching, the portions of semiconductor strips 146B and base 146A remain. In other embodiments, the exposed portions of semiconductor fins 60A and 60B are not etched.

Referring again to FIG. 12A, an epitaxy is performed to re-grow epitaxy regions 68A and 68B. Epitaxy region 68A may be grown from the top surface of base 146A when fins 60A are etched, or may be grown directly from fins 60A. Epitaxy regions 68B are grown from the top surfaces of remaining semiconductor fins 60B or from strips 146B if fins 60B are etched. Epitaxy regions 68A and 68B form the source/drain regions of the resulting FinFETs. The respective step is illustrated as step 218 in the process flow shown in FIG. 17. In accordance with some embodiments of the present disclosure, epitaxy regions 68B are formed of silicon germanium doped with a p-type impurity such as boron, and epitaxy regions 68A are formed of silicon phosphorous. The FinFETs formed based on regions 68A and 68B are thus an n-type FinFET and a p-type FinFET, respectively. Epitaxy regions 68A and 68B may have upward facing facets and downward facing facets in accordance with some embodiments, or may have other shapes. In accordance with alternative embodiments, epitaxy regions 68A and 68B are formed of silicon germanium (doped with boron) and silicon phosphorous, respectively.

Figure 13:
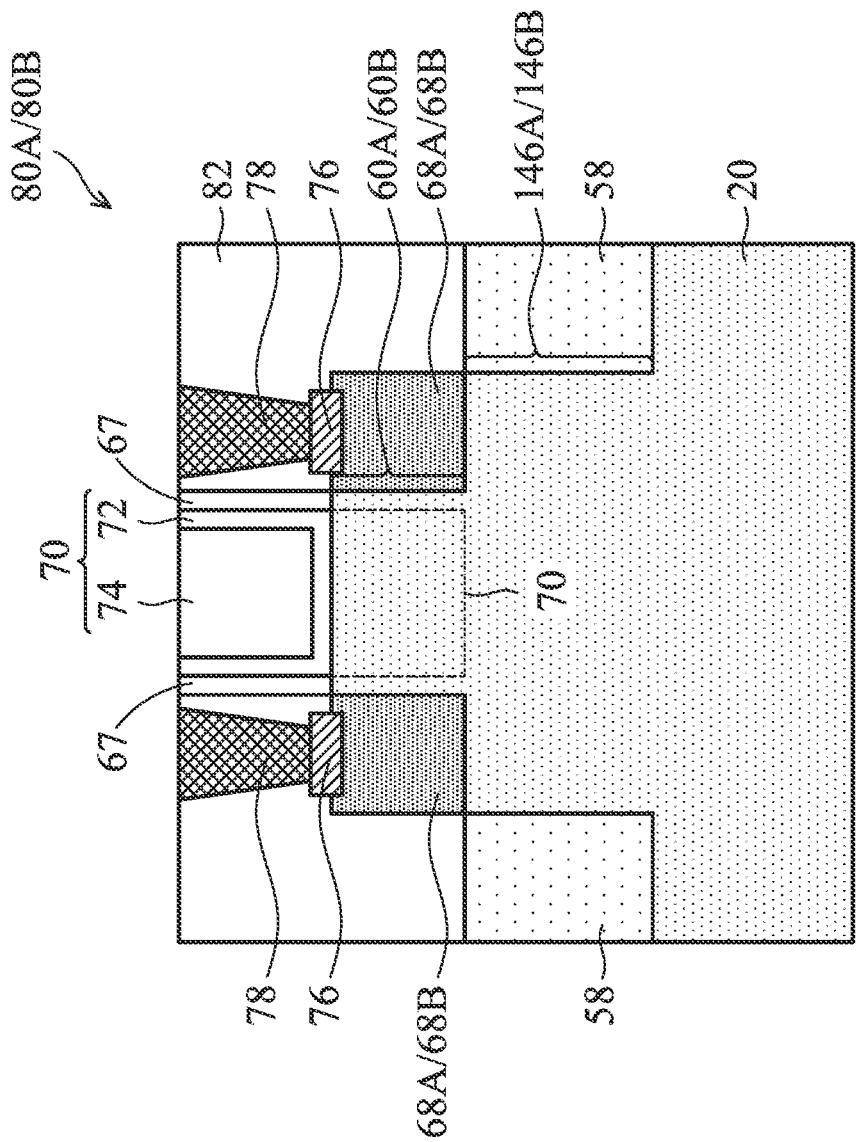

Subsequently, a plurality of process steps is performed to finish the formation of FinFETs 80A and 80B, as shown in FIG. 13. FinFET 80A represents the FinFET formed from crown-type active region 148A, and FinFET 80B represents the FinFET formed from the single-fin active regions 148B. An exemplary FinFET is illustrated in FIG. 13, which is marked as 80A/80B to indicate that both FinFETs 80A and 80B may have similar cross-sectional views. The dummy gate stacks 62 as shown in FIGS. 12A and 12B are replaced with replacement gates 70, with one replacement gate 70 shown in FIG. 13. Each of replacement gates 70 includes gate dielectric 72 on the top surfaces and sidewalls of the respective fin 60A or 60B, and gate electrode 74 over gate dielectric 72. Gate dielectric 72 may be formed through thermal oxidation, and hence may include thermal silicon oxide. The formation of gate dielectric 72 may also include one or a plurality of deposition steps, and the resulting gate dielectric 72 may include a high-k dielectric material or a non-high-k dielectric material. Gate electrode 74 is then formed on gate dielectric 72, and may be formed of metal stacks. The formation processes of these components are not discussed in detail. Source/drain silicide regions 76 are formed on the surfaces of source/drain regions 68A/68B. Source/drain contact plugs 78 are formed in Inter-Layer Dielectric (ILD) 82, and are electrically connected to the respective source/drain silicide regions 76.

In accordance with some embodiments, FinFET 80A is an n-type FinFET, and FinFET 80B is a p-type FinFET. Due to the material difference, epitaxy regions 68A of n-type FinFETs (silicon phosphorus, for example) tend to grow horizontally, and the portions of epitaxy regions 68A grown from different fins 60A can easily merge with each other. Accordingly, forming closely located fins 60A help forming a large merged source/drain. The drive current is thus higher, and it is easy to land source/drain contact plugs. On the other hand, epitaxy regions 68B of p-type FinFETs (silicon germanium boron, for example) tend not to grow horizontally.

It is thus more process friendly to form p-type FinFETs from discrete fins. The p-type FinFETs may be connected in parallel to generate large currents, if needed. In accordance with alternative embodiments, FinFET 80A is a p-type FinFET, and FinFET 80B is an n-type FinFET.

Figure 14:
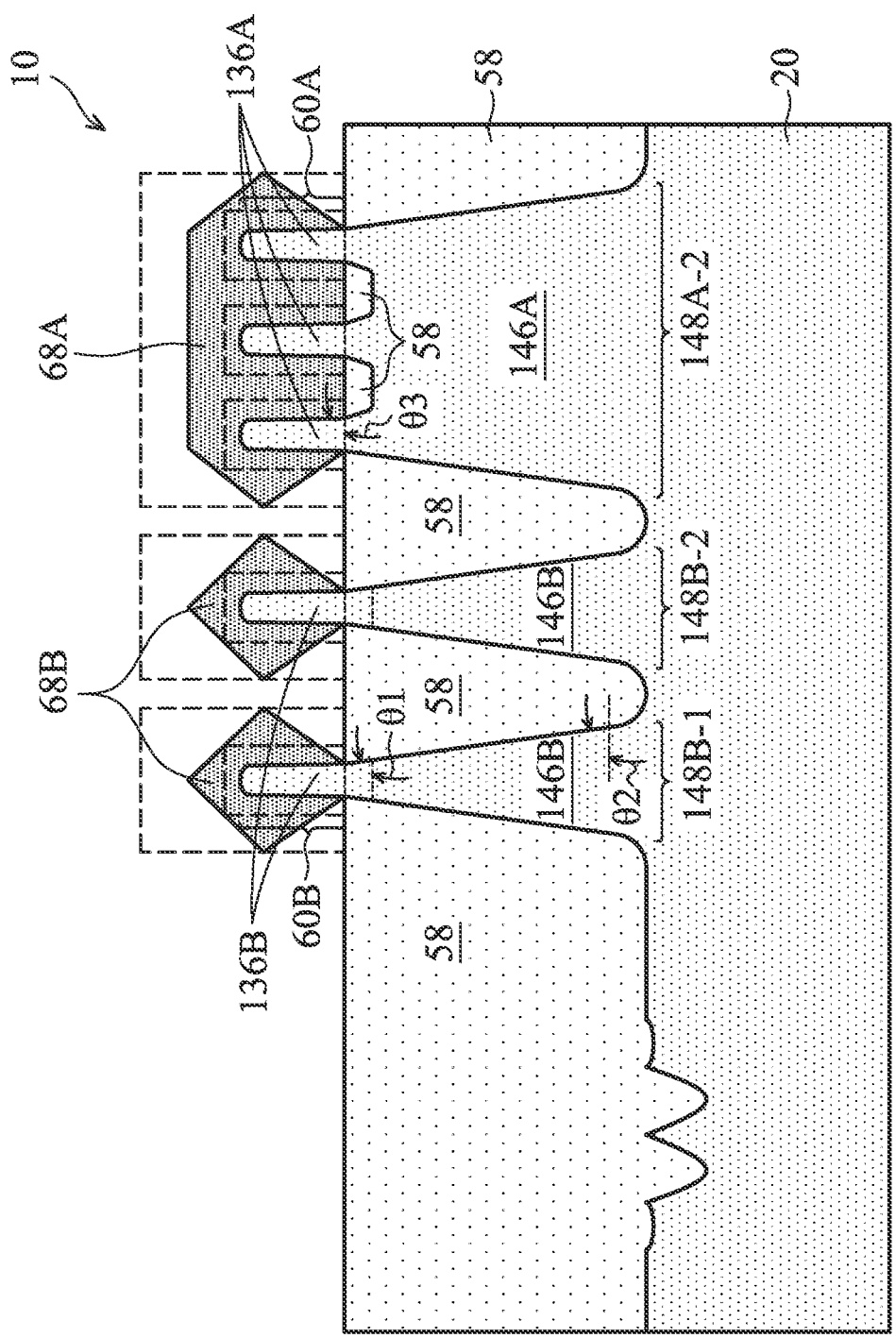
FIGS. 14 through 16 illustrate the cross-sectional views of FinFETs and the respective fin structures in accordance with some embodiments.
Figure 15:
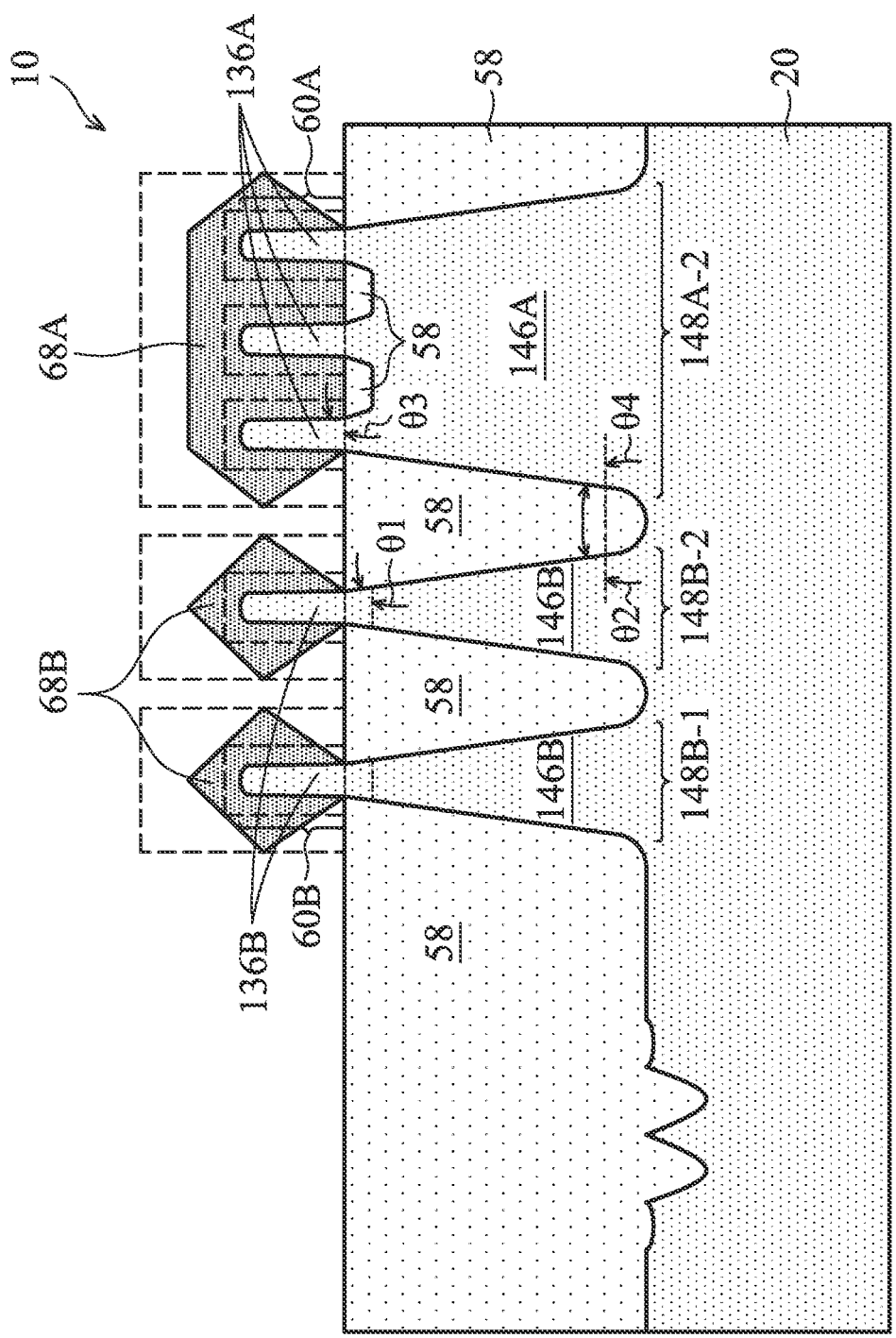
Figure 16:
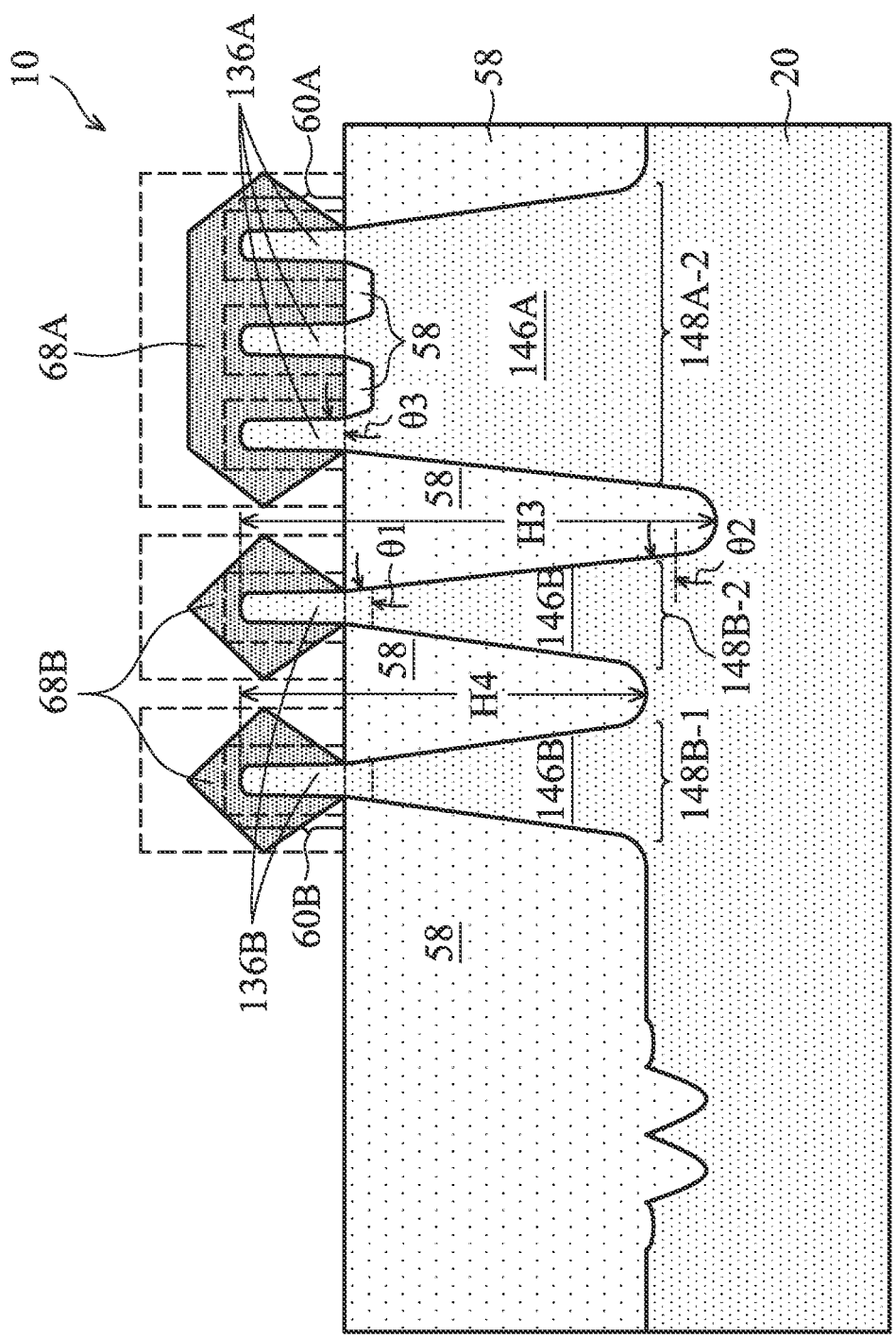

FIGS. 14 through 16 illustrate the profiles of various semiconductor strips 148A and 148B formed due to the process described in preceding paragraphs. The structures shown in FIGS. 14 through 16 correspond to the structure shown in FIG. 12A, with more details illustrated. Furthermore, the profiles of semiconductor strips/fins and isolation regions 58 also correspond to the corresponding parts in FIG. 13. In FIGS. 14 through 16, tilt angles θ1, θ2, and θ3 are obtained from the substantially straight portions of the sidewalls of semiconductor strips/fins. In FIGS. 14 through 16, horizontal dashed lines are drawn to mark the boundaries of strip portions 136B and 146B.

Referring to FIG. 14, semiconductor strips 136B have tilt angle θ1, which is smaller than 90 degrees, and hence the sidewalls of semiconductor strips 136B are slanted. Tilt angle θ1 of fins 60B (strip portions 136B) may be in the range between about 60 degrees and 90 degrees. Tilt angle θ2 of strip portions 146B may be in the range between about 50 degrees and about 80 degrees. Tilt angle θ3 of fins 60A may be in the range between about 60 degrees and 90 degrees. In accordance with some embodiments, tilt angle θ3 is greater than tilt angle θ2, wherein the difference (θ3−θ2) may be greater than about 10 degrees in accordance with some embodiments.

Semiconductor strips 148B include lower portions 146B and upper portions 136B. Due to the two separate etching processes for forming strip portions 146B and 136B, tilt angle θ1 of the sidewalls of upper strip portions 136B is greater than tilt angle θ2 of the sidewalls of lower strip portions 146B. Accordingly, the joint of strip portions 146B and 136B can be distinguished.

FIG. 15 illustrates the profiles of various semiconductor strips 148A and 148B in accordance with alternative embodiments. Due to the two-step etching process, and further due to the structural difference between strip 148B and the crown-based strip 148A, tilt angle θ2 of the lower strip portion 146B is greater than tilt angle θ4 of crown-base 146A. In accordance with some embodiments, tilt angle θ2 is in the range between about 60 degrees and 90 degrees, and tilt angle θ4 is in the range between about 60 degrees and 90 degrees, with a difference being greater than about 10 degrees or 15 degrees. Alternatively stated, due to the two-step etching, the sidewall of the single-fin strip portion 146B is steeper than the sidewall of the crown-shaped base 148A. In addition, tilt angle θ1 is also greater than tilt angle θ2, and tilt angle θ3 is greater than tilt angle θ2, similar to what is shown and discussed referring to FIG. 14.

FIG. 16 illustrates the profiles of various semiconductor strips 148A and 148B in accordance with alternative embodiments. Due to the two-step etching process, the trench (and the corresponding STI region) between strip 148B-2 and its immediate neighboring crown-shaped strip 148A-2 is deeper than the trench (and the corresponding STI region) between single-fin strips 148B-1 and 148B-2. For example, in FIG. 16, height H3 is greater than height H4. In accordance with some embodiments, height H3 is in the range between about 3 nm and about 1,000 nm, and height H4 is in the range between about 2 nm and about 800 nm. The difference (H3−H4) may be in the range between about 1 nm and about 100 nm.

The embodiments of the present disclosure have some advantageous features. The semiconductor strips, are formed in two etching steps. The second etching may result in semiconductor bases for some FinFETs (such as n-type FinFETs), and discrete strips for some other FinFETs (such as p-type FinFETs). This fits the property of the materials of the source/drain regions, and the resulting FinFETs are more process friendly.

In accordance with some embodiments of the present disclosure, a method includes, in a first etching step, etching a semiconductor substrate to form first recesses in a first device region and second recesses in a second device regions simultaneously. A first semiconductor strip is formed between the first recesses. A second semiconductor strip is formed between the second recesses. In a second etching step, the semiconductor substrate in the second device region is etched to extend the second recesses. The first recesses and the second recesses are filled with a dielectric material to form first and second isolation regions in the first and second recesses, respectively. The first isolation regions and the second isolation regions are recessed. Portions of the semiconductor substrate in the first device region protrude higher than top surfaces of the first isolation regions to form a first semiconductor fin. Portions of the semiconductor substrate in the second device region protrude higher than top surfaces of the second isolation regions to form a second semiconductor fin.

In accordance with some embodiments of the present disclosure, a method includes forming a plurality of mask rings, and removing portions of the plurality of mask rings. In a first etching step, the remaining portions of the plurality of mask rings are used to etch a semiconductor substrate. As a result, a first semiconductor strip and a second semiconductor strip are formed simultaneously, and the second semiconductor strip is in a semiconductor strip group including a plurality of semiconductor strips. A patterned photo resist is formed to protect the first semiconductor strip and the semiconductor strip group. In a second etching step, the semiconductor substrate is etched to simultaneously extend the first semiconductor strip deeper into the semiconductor substrate. A semiconductor base is thus simultaneously formed when the first semiconductor strip is extended, and the semiconductor strip group overlaps the semiconductor base.

In accordance with some embodiments of the present disclosure, a structure includes a discrete semiconductor strip, first isolation regions contacting opposite sidewalls of the discrete semiconductor strip, a semiconductor fin overlapping the discrete semiconductor strip, and a first gate stack on a top surface and sidewalls of the semiconductor fin. The structure further includes a semiconductor base at a same level as the discrete semiconductor strip, second isolation regions contacting opposite sidewalls of the semiconductor base, a plurality of semiconductor fins overlapping the semiconductor base, and a second gate stack on top surfaces and sidewalls of the plurality of semiconductor fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
in a first etching process, etching a semiconductor substrate to form first recesses in a first device region and second recesses in a second device region, wherein a first semiconductor strip is formed between the first recesses, and a semiconductor strip group comprising a second plurality of semiconductor strips is formed and defined by the second recesses;
forming an etching mask comprising:
a first portion covering the first semiconductor strip, wherein the first portion extends laterally beyond first opposing sidewalls of the first semiconductor strip;
a second portion covering the semiconductor strip group, wherein the second portion extends laterally beyond second opposing sidewalls of the semiconductor strip group, wherein a first sidewall of one of the first semiconductor strip and the second plurality of semiconductor strips contacts a second sidewall of the etching mask to form an interface;
in a second etching process, etching the semiconductor substrate, wherein in the second etching process, the first portion of the etching mask is recessed laterally to the first opposing sidewalls of the first semiconductor strip, and the first recesses extend downwardly; and
removing remaining portions of the etching mask, wherein at a time after the second etching process is performed and before the remaining portions of the etching mask are removed, the first sidewall is exposed.

2. The method of claim 1, wherein in the second etching process, the second portion of the etching mask recesses laterally, and outmost recesses among the second recesses extend downwardly to form a semiconductor base directly underlying the semiconductor strip group.

3. The method of claim 2, wherein during the second etching process, inner recesses among the second recesses remain to have same depths as before the second etching process.

4. The method of claim 2, wherein after the second etching process, the semiconductor base has an edge vertically aligned to an outer edge of an outmost fin in the semiconductor strip group.

5. The method of claim 2, wherein the second etching process results in a lower extension of the first semiconductor strip to be formed directly underlying the first semiconductor strip, and wherein an additional first sidewall of the first semiconductor strip and an additional second sidewall of the lower extension have a distinguishable change in tilt angles.

6. The method of claim 5, wherein the first sidewall is less vertical than the second sidewall.

7. The method of claim 1 further comprising:
filling the first recesses and the second recesses with a dielectric material to form first isolation regions in the first recesses and second isolation regions in the second recesses; and
recessing the first isolation regions and the second isolation regions, wherein a top portion of the first semiconductor strip protrudes higher than top surfaces of the first isolation regions to form a first semiconductor fin, and additional top portions of the second plurality of semiconductor strips protrude higher than top surfaces of the second isolation regions to form second semiconductor fins.

8. The method of claim 1, wherein after the second etching process, one of the second recesses on an outer side of the semiconductor strip group extends downwardly deeper into the semiconductor substrate than the first recesses.

9. The method of claim 1, wherein the etching mask comprises a photo resist.

10. A method comprising:
forming a plurality of mask rings;
removing some portions of the plurality of mask rings;
in a first etching process, using remaining portions of the plurality of mask rings to etch a semiconductor substrate, wherein a first semiconductor strip and a second semiconductor strip are formed simultaneously, and the second semiconductor strip is in a semiconductor strip group comprising a plurality of semiconductor strips, and the plurality of semiconductor strips comprise bottoms at a first level;
forming a patterned photo resist to protect the first semiconductor strip and the semiconductor strip group, wherein the patterned photo resist comprises a first portion covering the first semiconductor strip, and the first portion of the patterned photo resist extends laterally beyond a first edge of the first semiconductor strip; and
in a second etching process, etching the semiconductor substrate to extend the first semiconductor strip deeper into the semiconductor substrate, wherein the first semiconductor strip comprises an upper portion formed by the first etching process, and a lower portion formed by the second etching process, and the lower portion comprises a second edge underlying and substantially flush with the first edge.

11. The method of claim 10, wherein in the second etching process, the first portion of the patterned photo resist extending laterally beyond the first edge of the first semiconductor strip is laterally recessed back to the first edge.

12. The method of claim 10, wherein the patterned photo resist further comprises a second portion covering the semiconductor strip group, wherein the second portion of the patterned photo resist extending laterally beyond outmost edges of the semiconductor strip group are laterally recessed back to the outmost edges.

13. The method of claim 10, wherein the semiconductor strip group comprises an intermediate strip, and in the second etching process, a height of the intermediate strip remains unchanged.

14. The method of claim 10, wherein the first etching process and the second etching process further result in a third semiconductor strip to be formed, and the method further comprises removing the third semiconductor strip.

15. The method of claim 10, wherein in the second etching process, a semiconductor base is formed directly underlying the semiconductor strip group, and an edge of the semiconductor base is flushed with an additional outermost edge of the semiconductor strip group.

16. The method of claim 10 further comprising:
filling a dielectric material to opposing sides of the first semiconductor strip to form isolation regions;
recessing the isolation regions, wherein a top portion of the first semiconductor strip forms a first semiconductor fin; and
forming a Fin Field-Effect Transistor (FinFET) based on the first semiconductor fin.

17. A method comprising:
etching a semiconductor substrate to form a crown-shaped semiconductor strip, wherein the etching comprises:
performing a first etching process on the semiconductor substrate to form a plurality of semiconductor strips, wherein an outmost semiconductor strip in the plurality of semiconductor strips comprises a first outer edge;

forming a blanket photo resist;

performing a patterning process on the blanket photo resist to form a patterned photo resist comprising a portion covering the plurality of semiconductor strips, wherein the first outer edge of the outmost semiconductor strip in the plurality of semiconductor strips is in contact with a sidewall of the portion of the patterned photo resist; and performing a second etching process to form a semiconductor base directly underlying the plurality of semiconductor strips, wherein the semiconductor base comprises a second outer edge vertically aligned to the first outer edge, and wherein during the second etching process, the portion of the patterned photo resist is removed to reveal the first outer edge of the outmost semiconductor strip.

18. The method of claim 17, wherein opposing edges of the semiconductor base are vertically aligned to edges of outmost strips in the plurality of semiconductor strips.

19. The method of claim 18, wherein the plurality of semiconductor strips comprises an intermediate strip between the outmost strips, and in the second etching process, the intermediate strip is protected from being etched.

20. The method of claim 17, wherein at a time the second etching process is started, the first outer edge of the outmost semiconductor strip contacts the portion of the patterned photo resist to form a vertical interface, and wherein at a second time the second etching process is ended, the first outer edge of the outmost semiconductor strip is revealed.

* * * * *